(12) United States Patent
Kato et al.

(10) Patent No.: US 8,927,440 B2
(45) Date of Patent: Jan. 6, 2015

(54) FILM DEPOSITION APPARATUS AND METHOD OF DEPOSITING FILM

(71) Applicant: Tokyo Electron Limited, Tokyo (JP)

(72) Inventors: Hitoshi Kato, Iwate (JP); Shigehiro Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 81 days.

(21) Appl. No.: 13/936,523

(22) Filed: Jul. 8, 2013

(65) Prior Publication Data

US 2014/0017905 A1 Jan. 16, 2014

(30) Foreign Application Priority Data

Jul. 13, 2012 (JP) ................................. 2012-157728

(51) Int. Cl.
| | |
|---|---|
| *H01L 21/302* | (2006.01) |
| *H01L 21/461* | (2006.01) |
| *H01L 21/02* | (2006.01) |
| *C23C 16/455* | (2006.01) |
| *C23C 16/458* | (2006.01) |

(52) U.S. Cl.
CPC ...... *H01L 21/0228* (2013.01); *C23C 16/45508* (2013.01); *C23C 16/45551* (2013.01); *C23C 16/45587* (2013.01); *C23C 16/4584* (2013.01)
USPC .................... 438/782; 438/758; 257/E21.211; 257/E21.482; 118/696; 118/697; 118/725; 118/730

(58) Field of Classification Search
None
See application file for complete search history.

(56) References Cited

U.S. PATENT DOCUMENTS

2009/0324826 A1* 12/2009 Kato et al. ............... 427/255.28
2011/0104395 A1* 5/2011 Kumagai et al. ............. 427/554
2011/0159702 A1* 6/2011 Ohizumi et al. ............ 438/778

FOREIGN PATENT DOCUMENTS

JP 2011-100956 5/2011

* cited by examiner

*Primary Examiner* — Charles Garber
*Assistant Examiner* — Abdulfattah Mustapha
(74) *Attorney, Agent, or Firm* — IPUSA, PLLC

(57) ABSTRACT

A film deposition apparatus that laminates layers of reaction product by repeating cycles of sequentially supplying process gases that mutually reacts in a vacuum atmosphere includes a turntable receiving a substrate, process gas supplying portions supplying mutually different process gases to separated areas arranged in peripheral directions, and a separation gas supplying portion separating the process gases, wherein at least one process gas supplying portion extends between peripheral and central portions of the turntable and includes a gas nozzle discharging one process gas toward the turntable and a current plate provided on an upstream side to allow the separation gas to flow onto its upper surface, wherein a gap between the current plate and the turntable is gradually decreased from a central side of the turntable to a peripheral side of the turntable, and the gap is smaller on the peripheral side by 1 mm or greater.

5 Claims, 21 Drawing Sheets

FILM DEPOSITION APPARATUS AND METHOD OF DEPOSITING FILM

CROSS-REFERENCE TO RELATED APPLICATIONS

This patent application is based upon and claims the benefit of priority of Japanese Patent Application No. 2012-157728 filed on Jul. 13, 2012, the entire contents of which are incorporated herein by reference.

BACKGROUND OF THE INVENTION

1. Field of the Invention

The present invention relates to a technical field of a film deposition apparatus which deposits a thin film by laminating reaction products by sequentially supplying process gases, which mutually react, onto the substrates while the substrates are orbitally revolved.

2. Description of the Related Art

As one of film deposition techniques in a semiconductor manufacturing process, there is an Atomic Layer Deposition (ALD) method. According to this ALD method, a plurality types of process gases (reaction gases), which mutually react, are sequentially supplied on the surface of a semiconductor wafer (hereinafter, referred to as a wafer) to thereby laminate reaction products. A known film deposition apparatus, with which a film is deposited by the ALD method is structured such that a turntable, on which a plurality of wafers are mounted so as to be arranged in a peripheral direction, are orbitally revolved around so that the wafers sequentially pass areas where process gases are supplied. This film deposition apparatus includes a separating area, into which a separation gas including an inert gas, for example, a nitrogen gas is supplied, in order to prevent a plurality of processing gases from being mixed in the rotational direction of the turntable (to separate the process gases). An exemplary plurality of process gases is a raw gas to be absorbed on the wafers and a gas for oxidizing or nitriding the raw gas.

When the separation gas flows into an area supplied with the raw gas along with the rotation of the turntable, the raw gas is diluted by the separation gas and in-plane evenness in the film thickness is degraded. To deal this, the flow rate of the raw gas is required to be increased. Therefore, the cost increases. Japanese Laid-open Patent Publication No. 2011-100956 discloses a structure that a current plate is provided over a gas nozzle which extends in a radial direction of the turntable and a separation gas flows in a supplying area into which a raw gas is supplied after the separation gas overleaps the current plate.

By providing the current plate over the gas nozzle, it is possible to improve adsorption efficiency of the raw gas onto the wafer even though a supply flow rate of the raw gas is reduced.

SUMMARY OF THE INVENTION

Accordingly, embodiments of the present invention may provide a new and useful film deposition apparatus and a method of depositing a film.

According to a first aspect of the embodiments, there is provided a film deposition apparatus for obtaining a thin film by laminating layers of reaction product by repeating a plurality of cycles of sequentially supplying a plurality of types of process gases that mutually reacts in a vacuum atmosphere including a turntable that is arranged inside a vacuum chamber and receives the substrate on the turntable to cause the substrate to orbitally revolve; a plurality of process gas supplying portions for supplying mutually different process gases to separated areas separated in peripheral directions of the turntable; a separation gas supplying portion for supplying a separation gas which separates the mutually different process gases; and an evacuating mechanism for evacuating an inside of the vacuum chamber so as to be a vacuum, wherein at least one process gas supplying portion of the plurality of process gas supplying portions extends between a peripheral portion of the turntable and a central portion of the turntable, the at least one process gas supplying portion includes a gas nozzle having gas discharge ports arranged in a longitudinal direction of the at least one process gas supplying portion for discharging one process gas of the mutually different process gases toward the turntable and a current plate provided on an upstream side of a rotational direction of the turntable from the gas nozzle and along the longitudinal direction of the gas nozzle to allow the separation gas to flow onto an upper surface of the current plate, and wherein the current plate is provided so that a gap between the current plate and the turntable is gradually decreased from one end on a central side of the turntable to another end on a peripheral side of the turntable, and the gap at said another end is smaller than the gap at said one end by 1 mm or greater.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

However, according to the above technique, the speed in the peripheral portion of the turntable is several times higher than the speed on the central portion. Therefore, the separation gas is apt to be drawn into the lower side of the current plate from the upstream side of the rotational direction of the turntable on the side of the peripheral portion than on the side of the central portion. When the speed of the turntable is slow, a pull-in flow toward a lower side of the current plate is weakened by an influence of the evacuation gas flow into the evacuation port. However, since the rotation speed of the turntable is increased in order to enhance the productivity, the pull-in flow toward the lower side of the current plate on the side of the peripheral portion becomes strong. Therefore, the degree of diluting the process gas by the separation becomes high to thereby make a tendency of reducing the film thicknesses of the wafers on a part around the peripheral portion of the turntable in comparison with the film thicknesses of the wafers on a part around the center portion of the turntable becomes conspicuous. Therefore, the in-plane evenness in the film thickness is caused to be degraded.

The embodiments of the present invention are provided to solve the problems in consideration of the above. The embodiments provide a film deposition apparatus where substrates on the turntable are orbitally revolved around, a process gas is supplied from a process gas supplying portion including a gas nozzle and a current plate, and the in-plane evenness is prevented from degrading by a pull-in of the separation gas onto the lower side of the current plate, and a method of depositing a film using the film deposition apparatus.

Figure 2:
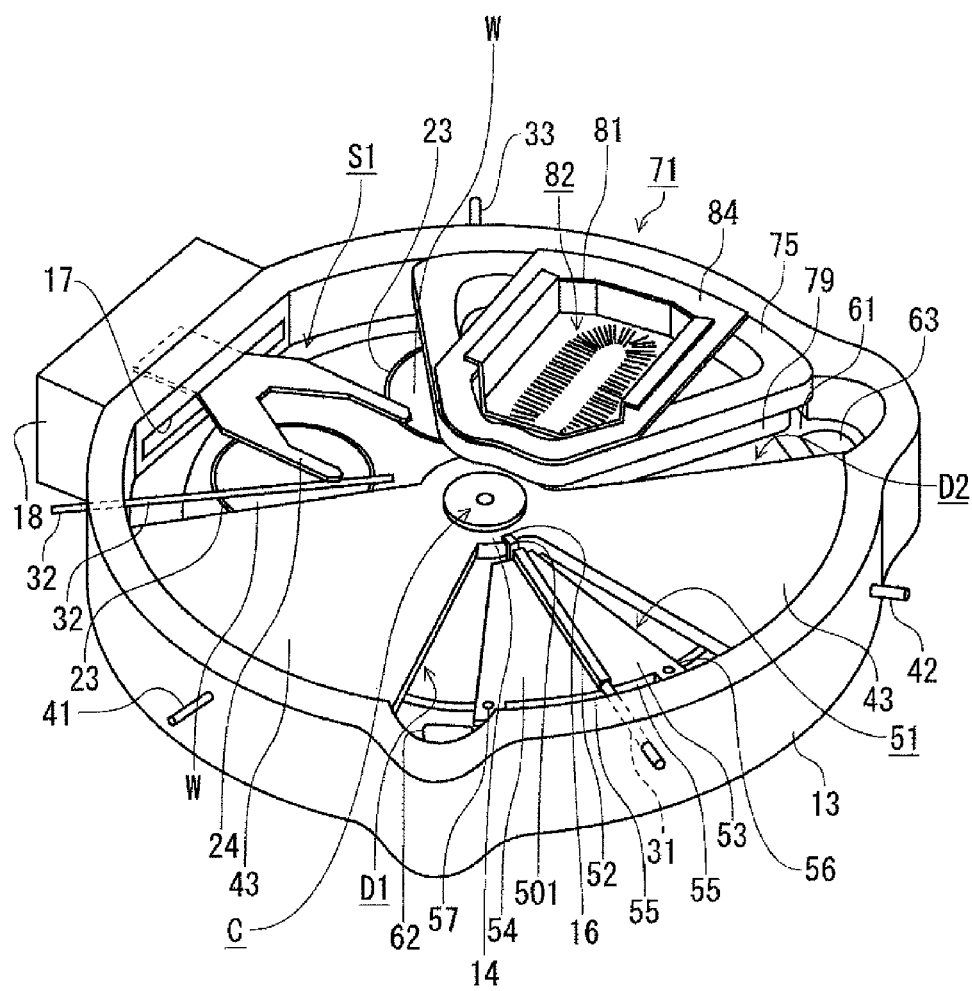
FIG. 2 is a perspective view of the film deposition apparatus.
Figure 3:
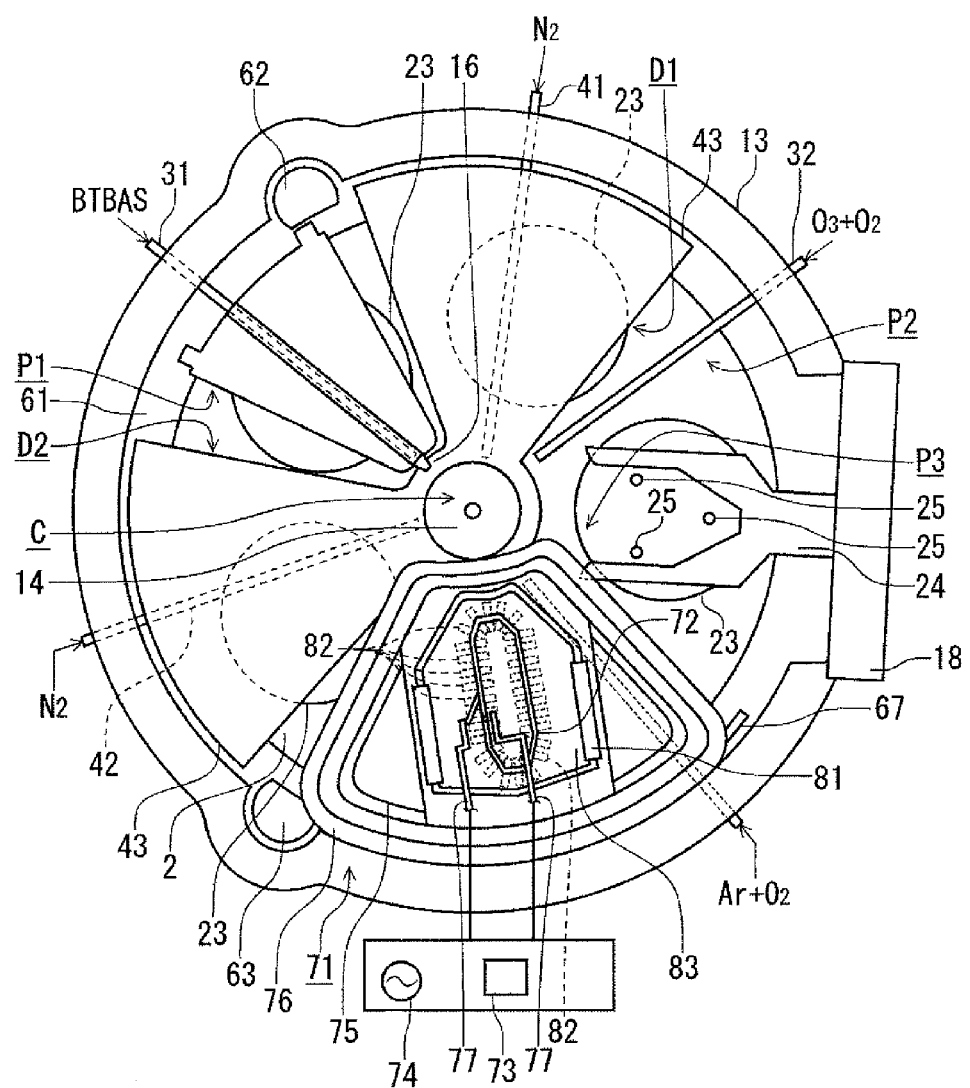
FIG. 3 is a horizontal plan view of the film deposition apparatus.

A film deposition apparatus of the embodiment of the present invention is described with reference to FIGS. 1 to 3.

In the embodiments described below, the reference symbols typically designate as follows:
D1: first separating area;
D2: second separating area;
W: wafer;
1: film deposition apparatus;
11: vacuum chamber;
2: turntable;
31: first process gas nozzle;
32: second process gas nozzle;
41, 42: separation gas nozzle;
51: nozzle cover;
52: cover body;
53, 54: current plate;
62: first vacuum evacuation port; and
63: second vacuum evacuation port.

Figure 1:
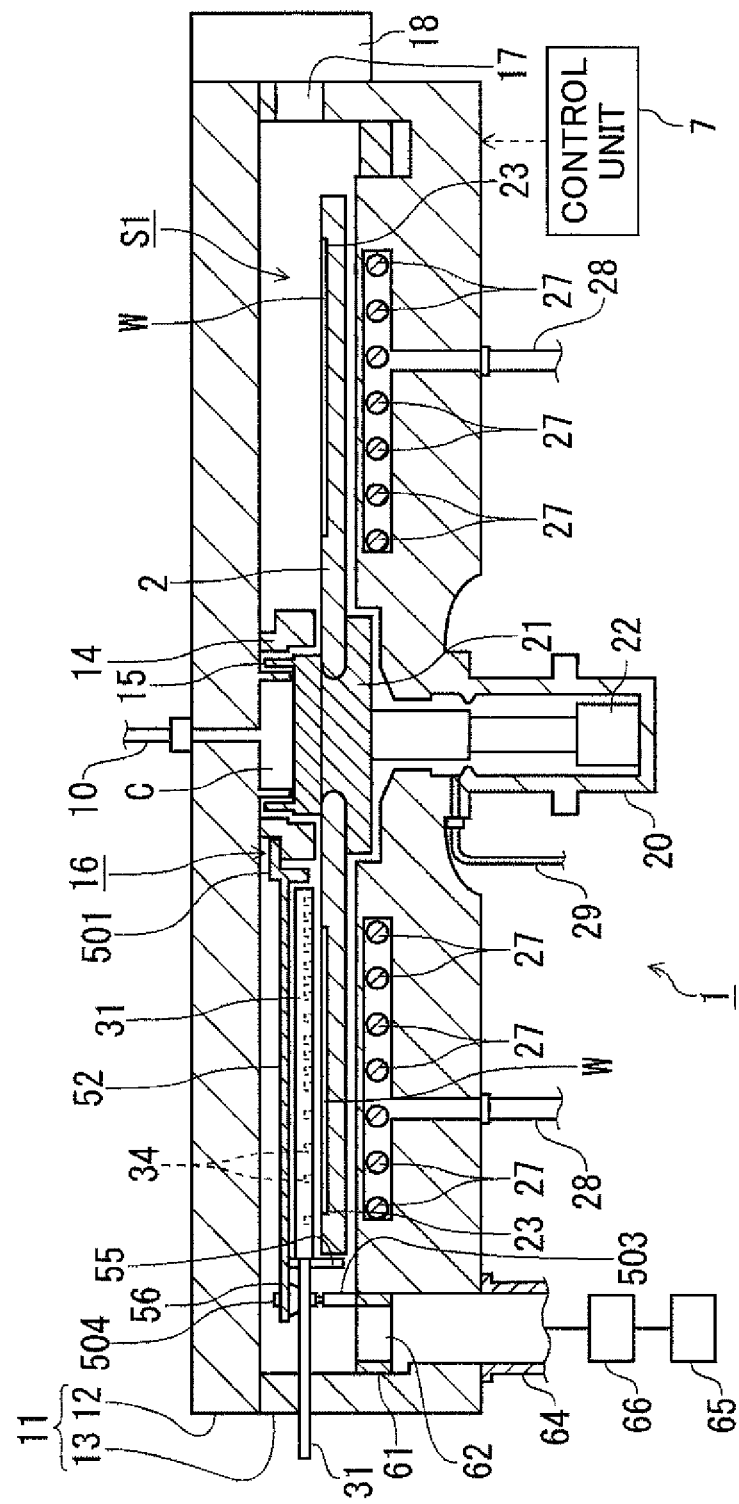
FIG. 1 is a vertical cross-sectional view of a film deposition apparatus of an embodiment.

FIG. 1 is a vertical cross-sectional view of a film deposition apparatus 1. FIG. 2 is a perspective view of the film deposition apparatus 1. FIG. 3 is a horizontal plan view of the film deposition apparatus 1. In the film deposition apparatus 1, two types of process gas, which mutually react, are sequentially supplied to a wafer W to deposit a thin film of silicon oxide ($SiO_2$) by the ALD method. Thereafter, the thin film is altered by plasma. The wafer W is mounted on the turntable 2 provided inside a vacuum chamber 11 forming the film deposition apparatus 1. Inside the vacuum chamber 11, the wafer W repeatedly and sequentially passes through a processing area where the wafer W is processed by the various process gases and an altering area where the wafer W is altered by the various process gases. Thus, formation of the thin film and alteration by the plasma are alternately performed to thereby form a film having a predetermined thickness on the wafer W.

The vacuum chamber 11 is provided inside the ambient atmosphere. The inside of the vacuum chamber is the vacuum atmosphere during the film deposition process. The vacuum chamber 11 is structure to be substantially a circle. The vacuum chamber includes a ceiling plate 12 and a chamber body 13 forming a side wall and a bottom portion of the vacuum chamber 11. The ceiling plate 12 is provided so as to be attachable to or detachable from the chamber body 13. Referring to FIG. 1, the ceiling plate 12 is attached to the chamber body 13. Referring to FIGS. 2 and 3, the ceiling plate 12 is detached from the chamber body 13.

A ring-shaped protrusion portion 14 substantially in a circular shape is provided in a central portion of the vacuum chamber 11 so as to downward protrude from the ceiling plate 12. A lower stage of the ring-shaped protrusion portion 14 has a diameter greater than an upper stage of the ring-shaped protrusion portion 14. The ring-shaped protrusion portion 14 and a supporting portion 21, which supports the turntable 2 at a center portion of the vacuum chamber 11, forms a center area C having a gas flow route 15. Referring to FIGS. 1-3, the reference symbol 10 is a supplying pipe for supplying a $N_2$ (nitrogen) gas as a purge gas to the gas flow route 15. The $N_2$ gas is supplied to the outer periphery of the turntable 2 across the surface of the turntable 2 from the gas flow route 15. Therefore, it is possible to prevent the process gases from mutually mixing in the center area C. Further, a cutout 16 is formed on the upper surface of the lower stage of the ring-shaped protrusion portion 14. The cutout is inward formed. The cutout 16 forms a supporting portion of a nozzle cover 51 described later.

The turntable 2 is shaped like a circle and outward extends from the supporting portion 21. The turntable 2 rotates in the clockwise direction around the center axis of the turntable 2 by a rotary mechanism 22 provided below the supporting portion 21. Five circular concave portions 23, which are substrate mounting areas, are formed along the rotational direction on a surface side (one surface side) of the turntable 2. The wafers W are mounted on the circular concave portions 23. By the rotation of the turntable 2, the wafers W on the circular concave portions 23 orbitally revolve around the center axis.

In the side wall of the vacuum chamber 11, a transfer opening 17 for the wafers W is formed. The transfer opening 17 can be freely opened and closed by a gate valve 18. The transfer mechanism 24 for carrying the wafer W in or out can enter into or exit from the vacuum chamber 11. A sent and received area S1 for sending and receiving the wafer W where the transfer mechanism 24 enters is provided inside the vacuum chamber 11 as illustrated in FIG. 2. A lift pin (not illustrated) is provided in the sent and received area S1 below the turntable 2. The lift pin passes through holes 25 provided in the circular concave portion 23 and can be extended or retracted over the surface of the turntable 2. With this, the wafer W can be sent and received between the circular concave portion 23 and the transfer mechanism 24.

Referring to FIG. 1, a heater 27 is provided at a position apart from the turntable below the turntable 2. The temperature of the turntable 2 increases by radiation heat applied to the turntable 2 by the heater 27. Thus, the wafer W is heated. The reference symbol 28 designates a purge gas supplying pipe for purging an area where the heater 27 is provided using a $N_2$ gas. A case body 20 covering a bottom center of the vacuum chamber 11 has a purge gas supplying portion 29 for supplying a $N_2$ gas as the purge gas from the central portion to the peripheral portion on the lower side of the turntable 2.

At positions facing a locus area of the circular concave portions 23 of the turntable 2, five nozzles 31, 32, 33, 41, and 42 are arranged mutually interposing intervals in the peripheral direction of the vacuum chamber 11. These nozzles 31, 32, 33, 41, and 42 are provided so as to horizontally extend, for example, from the outer peripheral wall of the vacuum chamber 11 to the center area C. In this example, the first process gas nozzle 31, the first separation gas nozzle 41, the second process gas nozzle 32, the plasma generating gas nozzle 33, and the second separation gas nozzle 42 are provided in the clockwise direction in this order.

The nozzles 31, 32, 33, 41, and 42 are connected to corresponding gas supplying sources having corresponding flow rate controlling valves or the like. The first processing gas nozzle 31 is connected to the gas supplying source for supplying a first processing gas containing silicon (Si) such as bis(tertiary-butylaminosilane) and a $SiH_2(NH-C(CH_3)_3)_2)$ gas. The second process gas nozzle 32 is connected to a supplying source of the second process gas, for example, an ozone ($O_3$) gas and an oxygen ($O_2$) gas, specifically, an oxygen gas supplying source having an ozonizer. The plasma generating gas nozzle 33 is connected to a supplying source of the plasma generating gas containing a mixed gas of, for example, an argon (Ar) gas and an oxygen gas. The first separation gas nozzle 41 and the second separation gas nozzle 42 are connected to corresponding supplying sources for supplying the $N_2$ gas as the separation gas.

Figure 4:
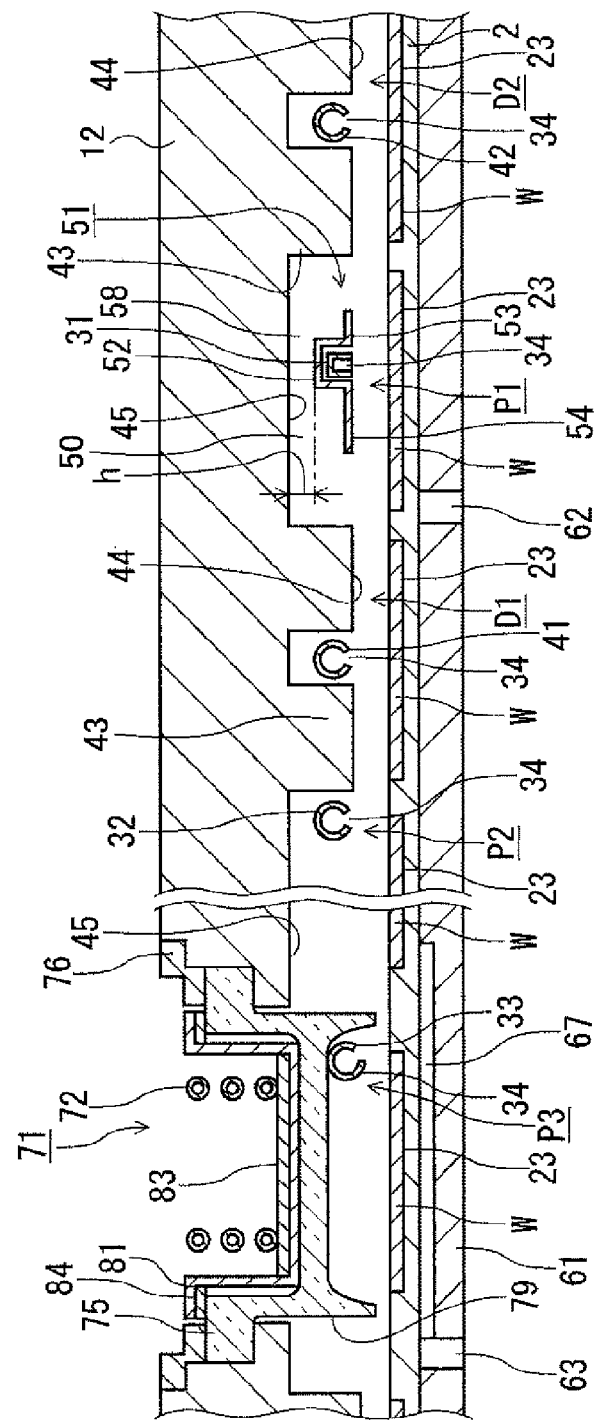
FIG. 4 is a vertical cross-sectional projected view of the film deposition apparatus taken along a peripheral direction.

FIG. 4 is a vertical cross-sectional projected view of the film deposition apparatus taken along the rotational direction of the turntable 2. A great number of the gas discharge ports 34 are formed along the length direction of each of the gas nozzles 31, 32, 33, 41, and 42. The gases stored in the supplying sources are discharged from the corresponding discharge ports 34. In order to prevent the concentration of the process gas on the central side of the turntable 2 from being lowered by the purge gas discharged from the center area C, the number of the gas discharge ports 34 is greater on the central side than on the peripheral side. Therefore, the flow rate of the process gas is higher on the central side than on the peripheral side. The gas discharge ports 34 of the plasma generating gas nozzle 33 discharge the gas obliquely downward toward the upstream side in the rotational direction in order to prevent the gas from entering into the plasma processing area P3 (described below) from the upstream side in the rotational direction.

A lower area of the first processing gas nozzle 31 and a lower area of the nozzle cover 51 provided to the first processing gas nozzle 31 form a first processing area P1 where a first process gas is supplied to cause the wafer W to absorb the first process gas. The nozzle cover 51 is described later in detail. A second process gas is supplied to a lower area of a second process gas nozzle 32. The lower area of the second process gas nozzle 32 forms a second processing area P2 where the first process gas absorbed by the wafer W reacts with the second process gas. The periphery of the plasma generating gas nozzle 33 is surrounded by a protruding portion 79 (described later) and forms a plasma processing area P3 as an altering area.

Two fan-like protrusion portions 43 are arranged below the ceiling plate 12 of the vacuum chamber 11 so as to downward protrude from the ceiling plate 12. The fan-like protrusion portions 43 are provided in the peripheral direction while a gap is interposed between the protrusion portions 43. The two fan-like protrusion portions are connected each other by the ring-shaped protrusion portion 14, which forms the center area C, on the rotational central side of the turntable 2. The separation gas nozzles 41 and 42 are accommodated in corresponding grooves provided in the fan-like protrusion portions 43. The separation gas nozzles 41 and 42 are accommodated inside the groove provided in the fan-like protrusion portion 43. The grooves are formed along radii of the fan-like protrusion portions 43. Said differently, ceiling surfaces (first ceiling surfaces) 44 that are lower surfaces of the fan-like protrusion portions 43 are formed on both sides of the separation gas nozzles 41 and 42 in the peripheral directions. Ceiling surfaces (second ceiling surfaces) 45 higher than the ceiling surfaces 44 are provided on both outer sides of the ceiling surfaces 44 in the peripheral directions.

Figure 5:
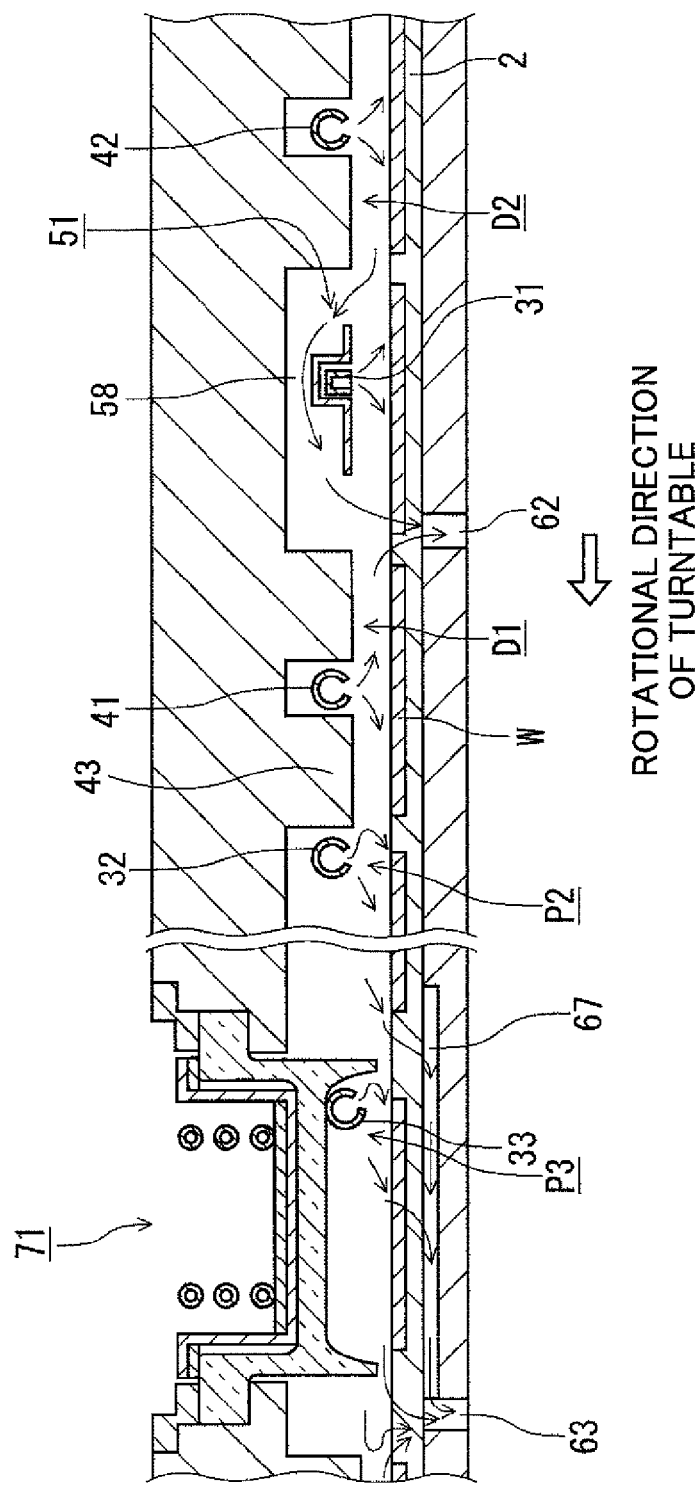
FIG. 5 is a vertical cross-sectional projected view of the film deposition apparatus taken along a peripheral direction.

Separating areas for preventing the first process gas and the second process gas from being mixed are formed below the first ceiling surfaces 44. The separating area including the separation gas nozzle 41 is referred to as a first separating area D1. The separating area including the separation gas nozzle 42 is referred to as a second separating area D2. At a time of the film deposition process, the $N_2$ gases (the separation gases) supplied from the first and second separation gas nozzles 41 and 42 to the first and second separating areas D1 and D2 spread inside the separating areas D1 and D2 in the peripheral directions, respectively. The spread $N_2$ gases push the first and second process gases and the plasma generating gas to evacuation ports 62 and 63, respectively. Referring to FIG. 5, gas flows at the time of the film deposition process are illustrated by arrows.

Figure 6:
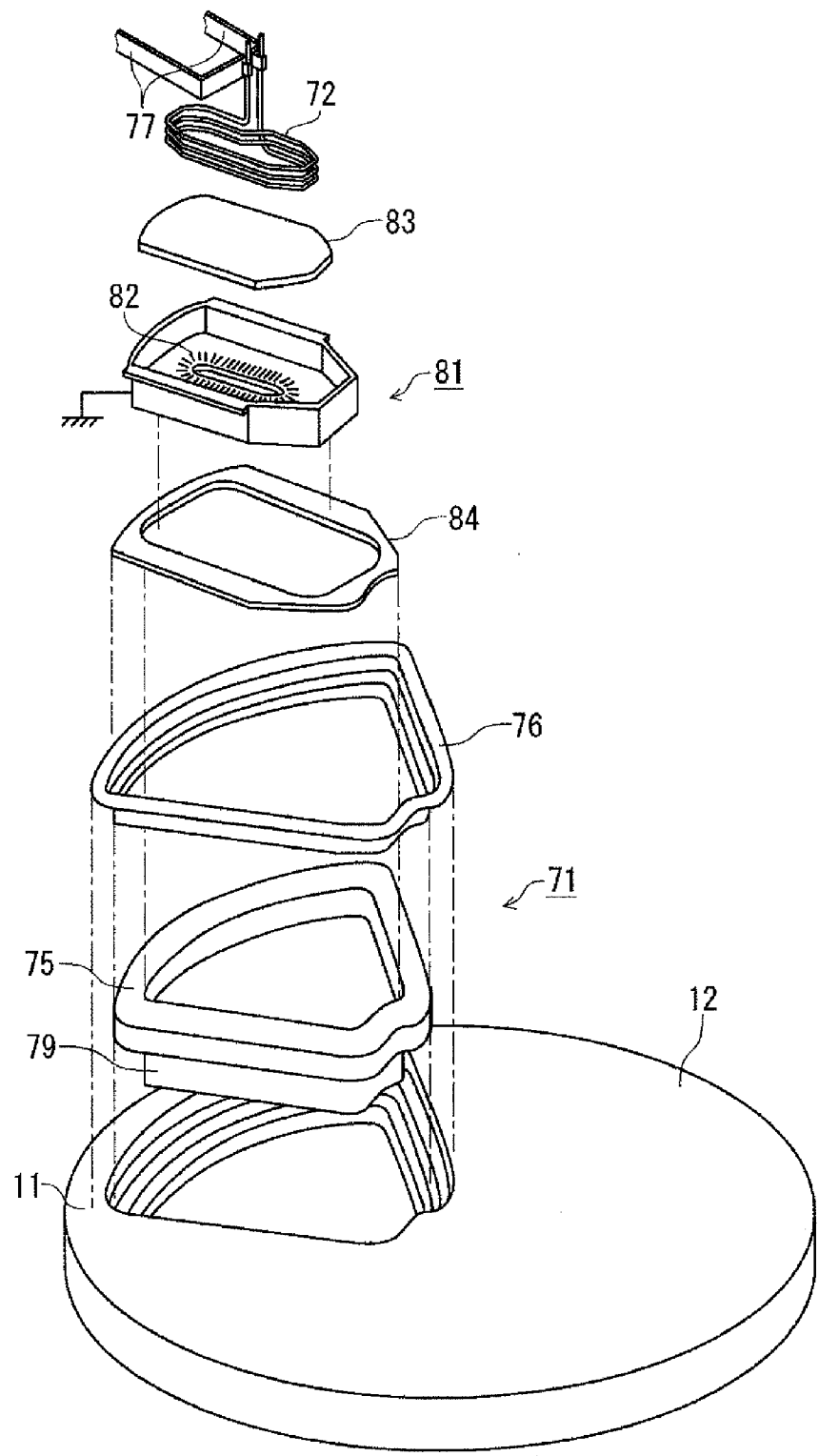
FIG. 6 is an expanded perspective view of a plasma processing unit provided in the film deposition apparatus.

Next, referring also to FIG. 6, the plasma processing unit 71 provided in the vacuum chamber 11 is described. FIG. 6 is an expanded perspective view of various portions of the plasma processing unit 71 provided in the vacuum chamber 11. The plasma processing unit 71 includes a coil-like antenna 72 made of a metallic wire. The antenna 72 is arranged so as to cover a part of the locus area between the central side of the turntable 2 and the outer peripheral side of the turntable 2 in a plan view of the turntable as illustrated in FIG. 3. The antenna 72 surrounds a band-like area extending in a radius direction of the turntable 2 and is shaped substantially like an octagon. Further, the antenna 72 is connected to a high frequency power source 74 through a matching box 73. The frequency of the high frequency power source 74 is, for example, 13.56 MHz. The output power from the high frequency power source 74 is, for example, 5000 W.

On the upper side of the above-described plasma generating gas nozzle 33, the ceiling plate 12 is opened substantially in a shape of a sector in its plan view. The opening portion is hermetically closed by a casing made of, for example, quartz. The antenna 72 is hermetically separated from the inside of the vacuum chamber 11. A peripheral portion of the casing 75 horizontally extends like a flange, and the central portion of the casing 75 is formed so as to dent toward the inner area of the vacuum chamber 11. The antenna 72 is accommodated inside the casing 75. The reference symbol 76 designates a pressing member. The pressing member downward pushes the peripheral portion of the casing 75. A connection electrode 77 electrically connects the plasma processing unit 71, the matching box 71, and the high frequency power source 74.

An outer edge portion of the lower surface of the casing 75 vertically extends toward the lower side (toward the turntable 2) along a peripheral direction of the outer edge portion so as to form a protruding portion 79 for regulating a gas. The protruding portion 79 is provided to prevent the separation gas and the second process gas from intruding into the lower area of the casing 75. The above-described plasma generating nozzle 33 is accommodated in an area surrounded by the inner peripheral surface of the protruding portion and the lower surface of the casing 75.

A Faraday shield 81 is arranged between the casing 75 and the antenna 72. The Faraday shield 81 is substantially in a box shape. The Faraday shield 81 is made of a metallic plate that is a conductive plate-like body and grounded. A great number of slits 82 are formed on a bottom surface of the Faraday shield 81. The slits 82 are formed to prevent an electric component, which is included in an electric field and a magnetic field, from directing the wafer W provided on the lower side and to cause a magnetic field to reach the wafer W. The slits 82 are formed so as to extend in a direction orthogonal to a direction of winding the antenna 72 and are provided at a position below and along the antenna 72 in the peripheral directions. Referring to FIG. 6, the reference symbol 83 designates an insulating plate for insulating the Faraday shield 81 from the antenna 72. The reference symbol 84 is a supporting portion for causing the Faraday shield 81 to be supported by the flange of the casing 75.

Other portions of the vacuum chamber 11 are described. Referring to FIGS. 1 and 3, a ring member 61 is arranged along the periphery of the vacuum chamber 11 on a lower outer peripheral side of the turntable 2. A first vacuum evacuation port 62 and a second vacuum evacuation port 63 are provided in the ring member 61. The first vacuum evacuation port 62 and the second vacuum evacuation port 63 are separated in the peripheral directions of the ring member 61. The second vacuum evacuation port 63 is at a position closer to the second separating area D2 relative to the plasma processing area P3. The first evacuation port 62 is provided to evacuate the first process gas and the separation gas. The second evacuation port 63 is provided to evacuate the second process gas, the plasma generating gas, and the separation gas.

The first and second vacuum evacuation ports 62 and 63 are connected to a vacuum pump 65 as a vacuum evacuating mechanism through corresponding evacuation pipes 64. A pressure controller 66 such as a butterfly valve is connected to each of the evacuation pipes 64. Evacuation amounts through the evacuation ports 62 and 63 are independently controlled. A groove 67 illustrated in FIGS. 3 and 4 is formed in the ring member 61. The groove 67 is formed from the second vacuum evacuation port 63 to the upstream side in the rotational direction along the periphery of the ring member 61. The groove 67 guides the second process gas supplied from the second process gas nozzle 32 and the separation gas supplied from the first separation gas nozzle 41 to the second vacuum evacuation port 63.

Figure 7:
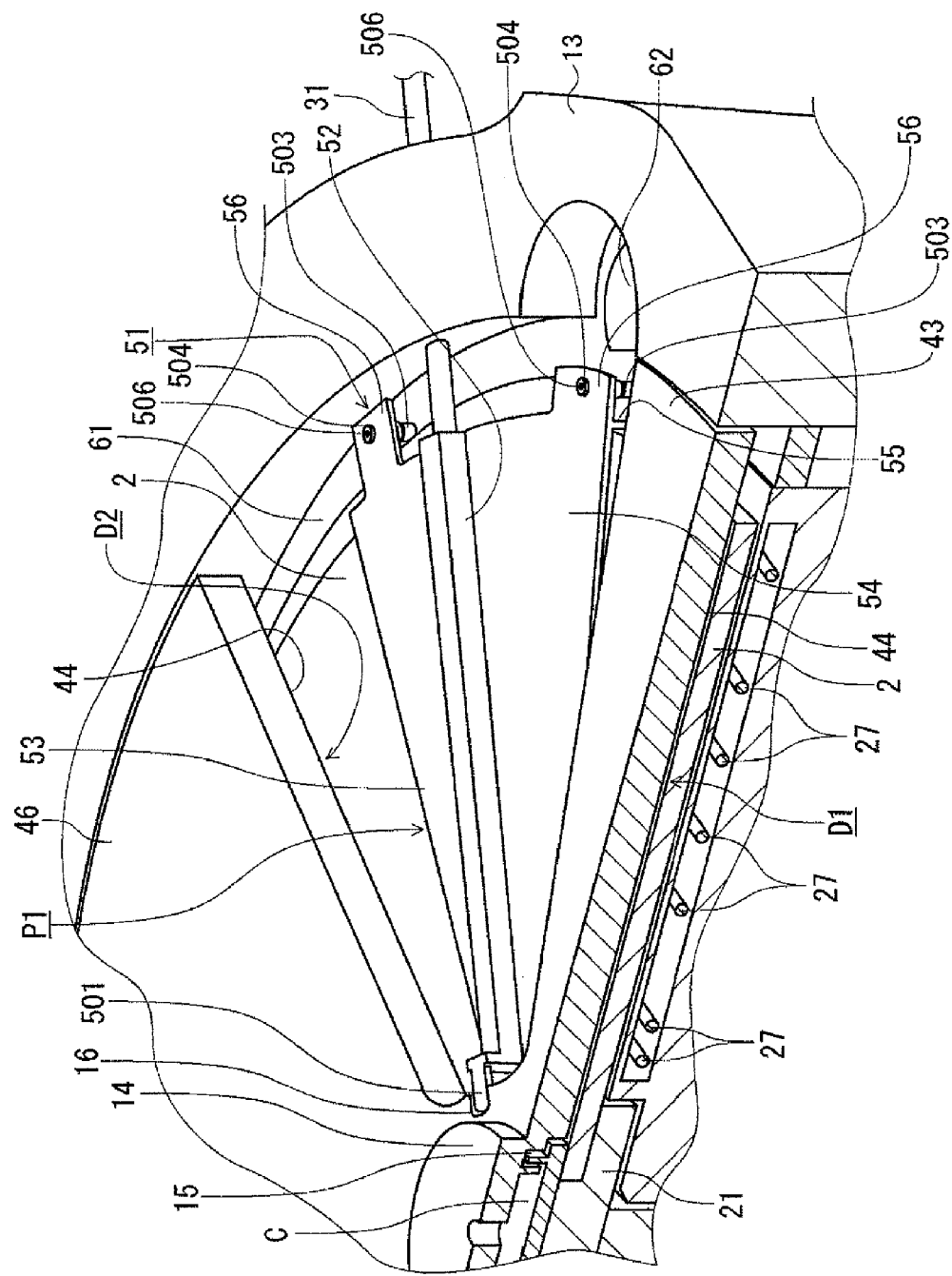
FIG. 7 is a perspective view of a nozzle cover provided in the film deposition apparatus viewed from an upper side of the film deposition apparatus.
Figure 8:
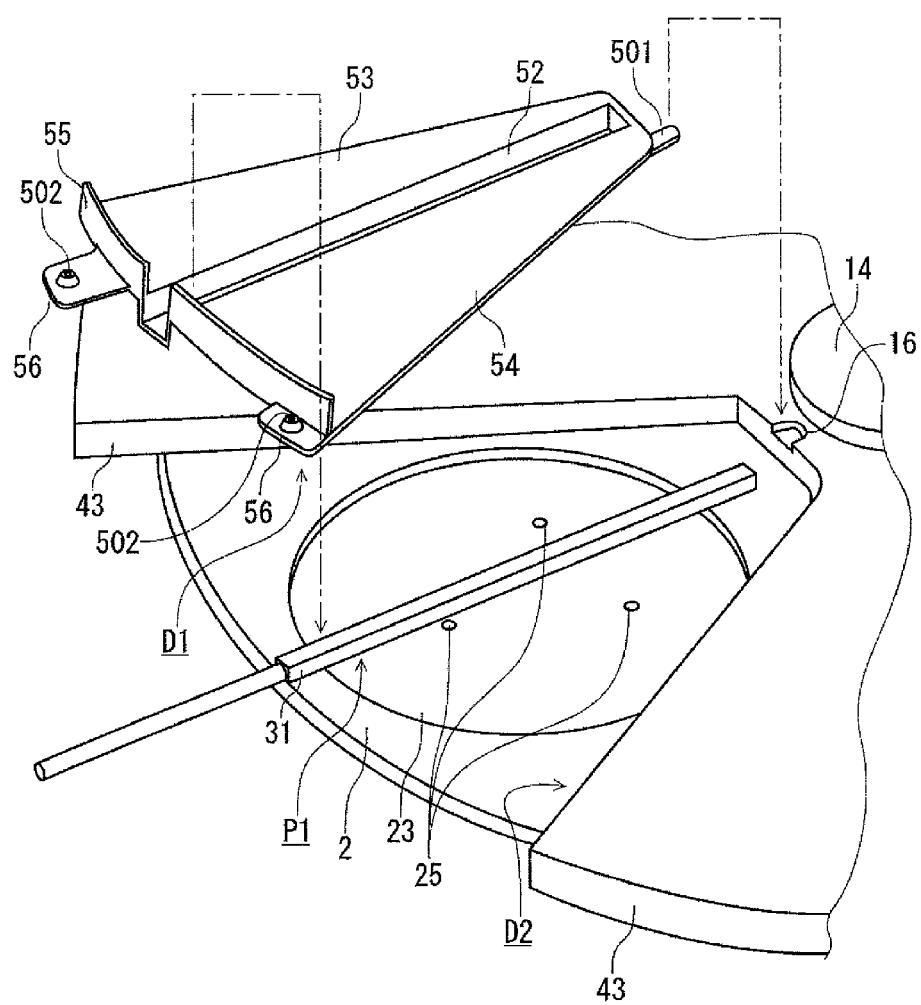
FIG. 8 is a perspective view of the nozzle cover viewed from the back surface side of the nozzle cover.
Figure 9:
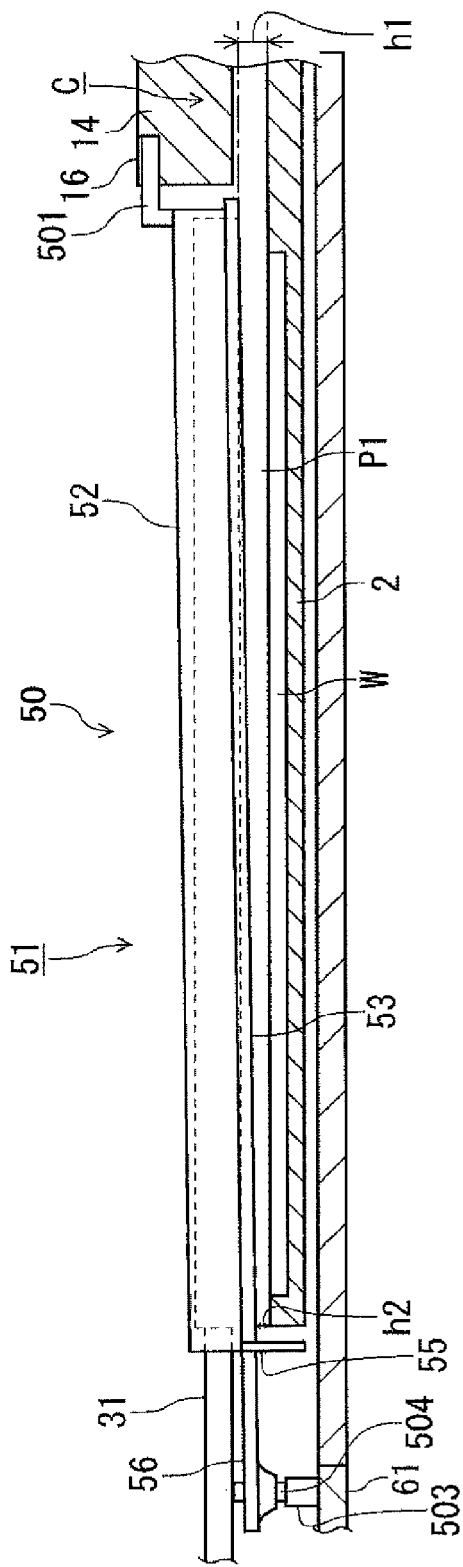
FIG. 9 is a side view of the nozzle cover.

Subsequently, the nozzle cover 51 is described. FIG. 7 illustrates an upper surface side of the nozzle cover 51 when the nozzle cover 51 is installed in the first process gas nozzle 31. FIG. 8 illustrates a lower surface side of the nozzle cover 51 after the nozzle cover is removed from the first process gas nozzle 31. FIG. 9 is a side view of the nozzle cover 51. A part of the first process gas nozzle 31 where the gas discharge ports 34 are provided is shaped like a rectangular column. The nozzle cover 51 includes a cover body 52 covering the upper side, both sides in the rotational directions, and the central side of the turntable 2 of the part of the first process gas nozzle 31 shaped like the rectangular column. The cover body 52 is formed to be a long and thin rectangular column directing from the outer peripheral side of the turntable 2 to the central side.

Figure 10:
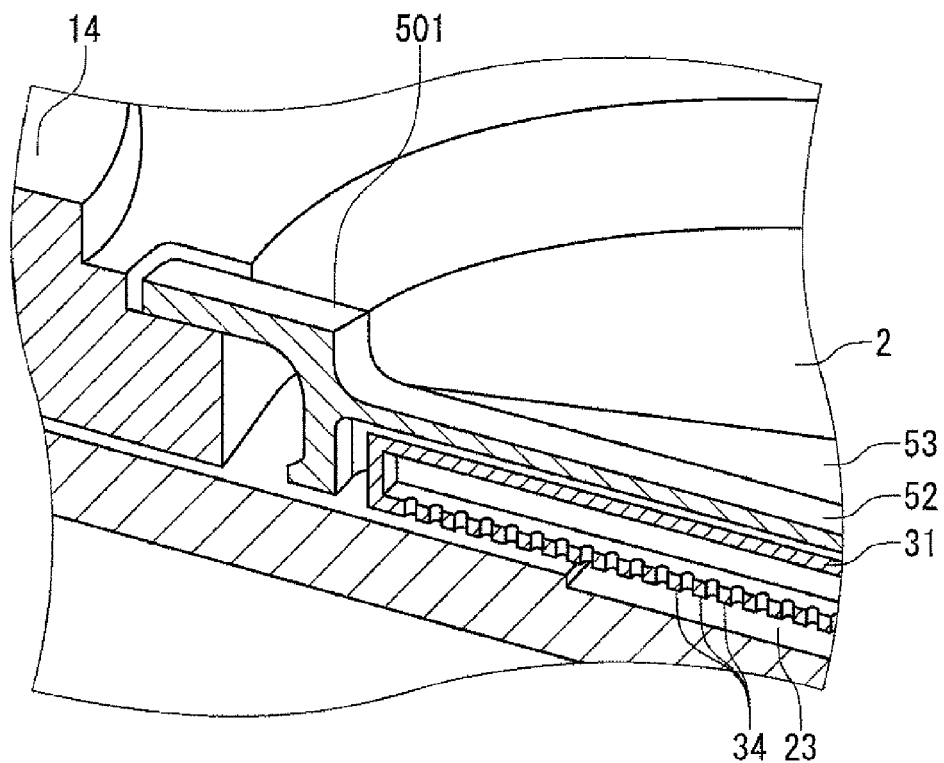
FIG. 10 is a cross-sectional perspective view of a part of the nozzle cover on a rotational central side of the turntable.

FIG. 10 is a cross-sectional perspective view of the cover body 52 on the central side of the turntable 2 (the rotational shaft side) of the turntable 2. Referring to FIG. 10, a protrusion 501 protruding toward the central side is provided in the cover body 52. The protrusion 501 is accommodated inside the cutout 16 of the ring-shaped protrusion portion 14 and supports the nozzle cover 51 on the turntable 2. Referring to FIGS. 4 and 10, a circulating space 50 is provided between the cover body 52 and the ceiling plate 12. The circulating space 50 circulates a gas between the upstream side and the downstream side in the rotational direction relative to the nozzle cover 51. The height h of the circulating space 50 is, for example, 5 to 15 mm.

Referring to FIG. 10, current plates 53 and 54 protrude from a lower end of the cover body 52 on the upstream and downstream sides in the rotational directions. The current plates 53 and 54 are along the longitudinal direction of the first process gas nozzle 31. The projection amounts of the current plates 53 and 54 increase more on the outer side of the turntable 2 along the longitudinal direction of the first process gas nozzle 31. Therefore, the nozzle cover 51 is substantially shaped like a fan in its plan view. The current plates 53 and 54 are downward bent in their outer peripheral sides to form facing portions 55 facing the outer periphery of the turntable. The facing portions and the wall portion of the central side of the turntable 2 prevent the first process gas supplied to the first processing area P1 from being pushed by the purge gas, which is supplied from the center area C to the peripheral edge of the turntable 2, and moved toward the peripheral edge of the turntable 2. Thus, the concentration of the first process gas in the radius direction of the turntable 2 is made more uniform.

Figure 11:
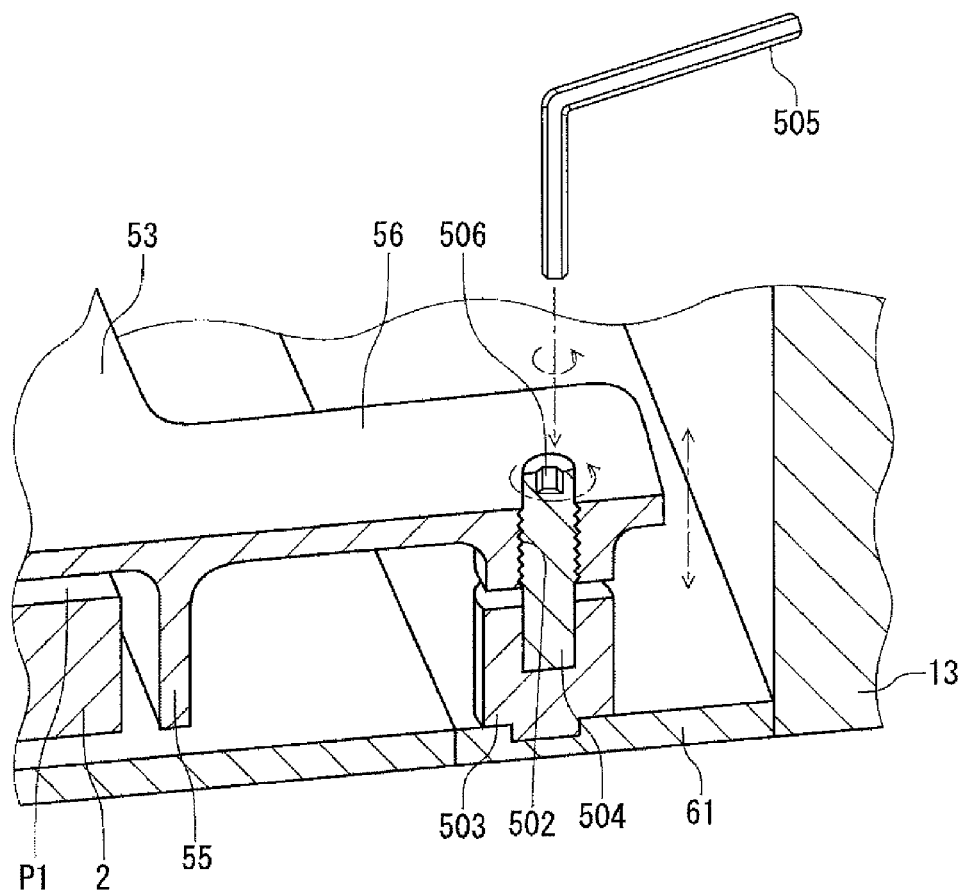
FIG. 11 is a cross-sectional perspective view of a part of the nozzle cover on an outer peripheral side of the turntable.

Referring to FIG. 7, extended portions 56 are formed from parts of the outer edge surface of the current plates 53 and 54. The extended portions 56 extend on the outer peripheral side of the turntable 2 at the facing portions 55 of the current plates 53 and 54 facing the chamber body 13. FIG. 11 is a cross-sectional perspective view of the extended portion 56 of the current plate 53. A through hole 502 is formed in the extended portion 56. Inner peripheral surfaces of the through holes 502 are threaded. A pillar 503 is provided in the ring member 61. A hexagon socket set screw 504, which forms a slant adjusting portion and extends in vertical directions, is provided in the pillar 503. The hexagon socket set screw 504 is rotatable on the pillar 503 around an axis of the hexagon socket set screw 504. The hexagon socket set screw 504 can be screwed together with internal threads inside the through hole 502. A hollow 506 for inserting a wrench 505 is formed on the upper surface of the hexagon socket set screw 504. A user of the film deposition apparatus 1 removes the ceiling plate 12 from the vacuum chamber 11. Then, the hexagon socket set screw 504 is rotated by the wrench 505 thereby moving up or down the extended portion 56 of the current plate 53 relative to the pillar 503. Thus, the height of the extended portion 56 can be adjusted.

Although the extended portion 56 of the current plate 53 is described, the extended portion 56 of the current plate 54 is similarly formed. Below the current plate 54, a pillar 503 is provided. Accordingly, the height of the extended portion 56 can be adjusted. In the nozzle cover 51, the fulcrum point is provided on the central side (one end side) of the turntable 2. Therefore, the height of the turntable 2 on the peripheral side can be adjusted. Therefore, the slants of the current plates 53 and 54 in their longitudinal directions can be adjusted. Referring to FIG. 9, a gap (hereinafter, a central gap) h1 between the current plate 53 and the turntable 2 on the central side of the turntable 2 is set to, for example 2 to 6 mm to acquire functions of the current plate 53 described later. A gap (hereinafter, a peripheral gap) h2 between the current plate 53 and the turntable 2 on the peripheral side of the turntable 2 is set to, for example 1 to 4 mm. The peripheral gap h2 is set to be smaller than the central gap H1 by 1 mm or greater. By setting as such, the gap between the current plate 53 and the turntable 2 gradually decreases from the central side of the turntable 2 to the peripheral side of the turntable 2. In order to obtain effects described below, the peripheral gap h2 is preferably smaller than the central gap h1 by 1.5 mm or greater.

The nozzle cover 51 and the gaps h1 and h2 between the current plate 53 and the turntable 2 are described. At the time of the film deposition process, gases are supplied from the gas nozzles 31 to 33, 41, and 42 as illustrated in FIG. 5 while the turntable 2 rotates. At this time, the first process gas discharged from the first process gas nozzle 31 flows along the wafer W between the current plates 53 and 54 and the turntable 2. Said differently, the current plates 53 and 54 suppresses diffusion of the first process gas around the first process gas nozzle 31 and makes reaction between the wafer W and the first process gas high. The current plate 53 guides the separation gas flowing from the second separation gas nozzle 42 to the first processing area P1 to the circulating space 50 and prevents the separation gas from entering the first processing area P1. With this, a drop of the concentration of the first process gas in the first processing area P1 is suppressed.

Figure 12:
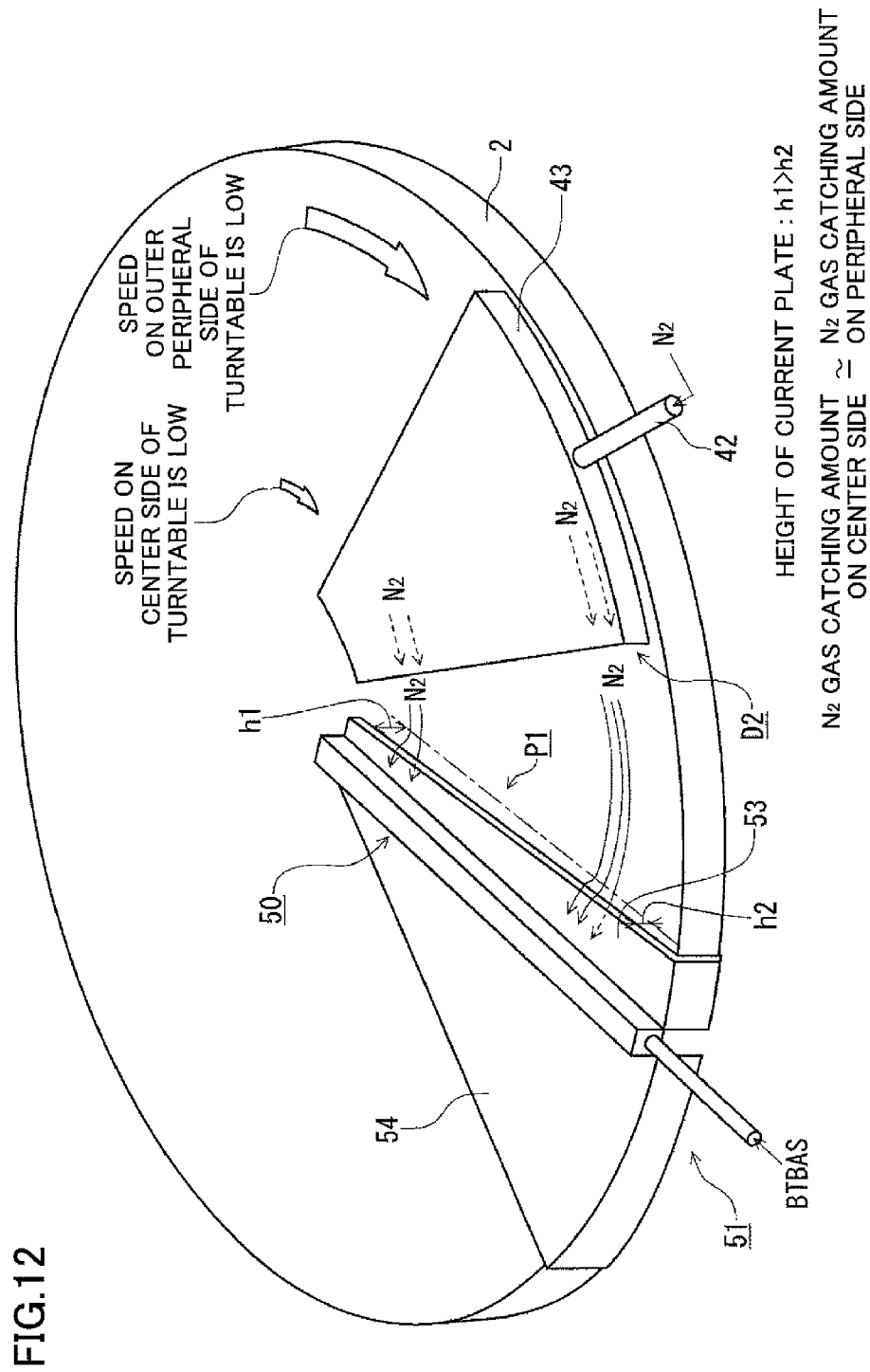
FIG. 12 schematically illustrates gas flows around the nozzle cover.

FIG. 12 schematically illustrates the nozzle cover 51 and the turntable 2. Referring to FIG. 12, flows of the separation gas (the $N_2$ gas) flowing from the second separation gas nozzle 42 to the first processing area P1 are schematically illustrated by arrows. Dotted lines are imaginary lines along the surface of the turntable 2. As described, the separation gas is guided to the circulating space 50. However, because the separation gas has viscosity, the separation gas is not completely guided into the circulating space 50. The separation gas may be caught by the rotation of the turntable 2. A part of the separation gas flows in the first processing area P1. The rotation speed of the turntable 2 is faster on the peripheral side than on the central side. As the rotation speed is faster, the amount of the separation gas being caught by the rotation and flowing into the first processing area P1 is apt to increase more. Therefore, the current plate 53 is arranged so that the current plate 53 approaches the turntable 2 more on the peripheral side of the turntable 2 than on the central side of the turntable 2 thereby preventing the entering amount of the separation gas onto the peripheral side of the turntable 2 is suppressed in the first processing area P1. Thus, it is possible to suppress variation of the concentration of the first process gas between the central side of the turntable 2 and the peripheral side of the turn table 2.

Depending on the rotation speed of the turntable 2, the amount of the separation gas caught by the first processing area P1 changes. Therefore, the central gap h1 and the peripheral gap h2 are appropriately set in response to the rotation speed of the turntable 2 at the time of film deposition process. Within this embodiment, the turntable 2 rotates at a speed of 240 rpm at the time of film deposition process, the central gap h1 is set to 3 mm, and the peripheral gap h2 is set to 1 mm. When the film deposition process is performed at about 20 rpm, the flow rate of the separation gas caught by the rotation of the turntable 2 is relatively low. Therefore, the gaps h1 and h2 may be, for example, 3 mm each. Said differently, the current plate 53 may be provided in parallel with the turntable 2. When the rotation speed of the turntable is 60 rpm or faster, the separation gas is apt to be caught as described above. Therefore, it is preferable to slant the current plate 53.

Figure 13:
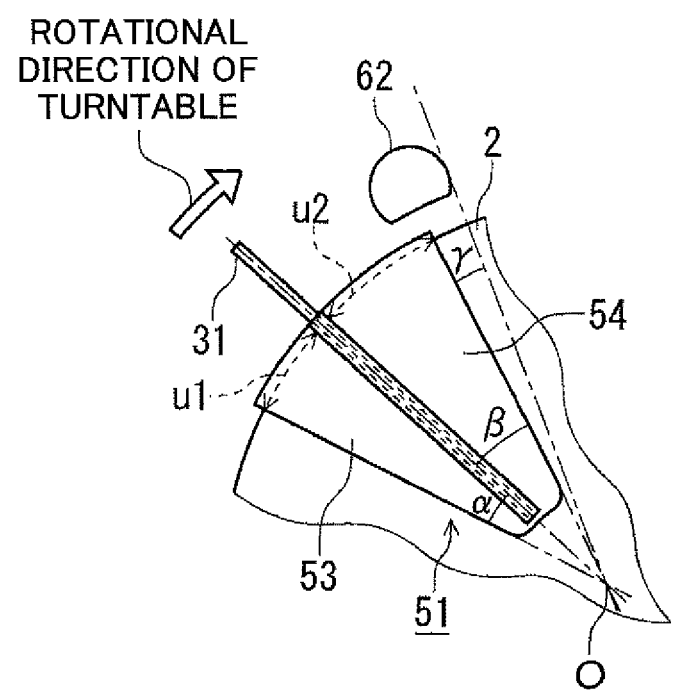
FIG. 13 is a plan view of the nozzle cover and a vicinity of the nozzle cover.

Within this embodiment, the current plate 54 is set to have a slant in its longitudinal direction is the same as that of the current plate 53. Said differently, the current plate 54 the central gap h1 in the current plate 54 and the peripheral gap h2 in the current plate 54 are 3 mm and 1 mm, respectively. Next, referring to a schematic plan view of FIG. 13, the other dimensions of the nozzle cover 51 are described. An angle $\alpha$ between the visible outline of the current plate 53 on the upstream side in the rotational direction and the extending direction of the first process gas nozzle 31 is, for example, 15°. Further, an angle $\beta$ formed between the visible outline of the current plate 53 on the downstream side in the rotational direction and the extending direction of the first process gas nozzle 31 is, for example, 22.5°. Here, the angle $\beta$ is greater than the angle angle $\alpha$. The lengths u1 and u2 of arcs of the current plate 53 and 54 on the outer edge portion of the turntable 2 are, for example, 120 mm and 180 mm, respectively. Since the current plates 53 and 54 are formed as illustrated in FIG. 13, the current plates 53 and 54 suppress diffusion of the first process gas on the peripheral side of the turntable 2 where the speed is high. Therefore, adsorption of the first process gas to the wafer is assisted.

In order to prevent limitation to a flow of the first process gas from the first process gas nozzle 31 to the first vacuum evacuation port 62, which may be caused by the current plate 54, an angle $\gamma$ between the visible outline of the current plate 54 on the downstream side in the rotational direction and a line (indicated by a dot chain line) connecting the center O of the turntable 2 and the end portion of the first vacuum evacuation port 62 on the downstream side of the rotational direction is set to 0° or greater. The angle $\gamma$ is 7.5° in this example. As described, the $N_2$ gas climbing the nozzle cover 51 passes over the nozzle cover 51, prevents contact with the turntable 2, and is evacuated to the first vacuum evacuation port 6.

The film deposition apparatus 1 includes a control unit 7 having a computer for controlling an entire operation of the film deposition apparatus 1. A program for performing a film deposition process is stored in the control unit 7. The program controls operations of various portions of the film deposition apparatus 1 by sending control signals to the various portions of the film deposition apparatus 1. Specifically, supplies and stops of the gases to the gas nozzles, generation and stop of plasma by turning on or off of a high frequency power source 74, a control of the rotation speed of the turntable 2 with the rotary mechanism 22, adjustment of the evacuation amounts from the evacuation ports 62 and 63 by a pressure controller 66. In the program, a group of steps are assembled so that various processes are performed as described below by controlling these operations. The program is installed inside the control unit 7 from a memory medium such as a hard disk, a compact disk, a magnet-optical disk, a memory card, and a flexible disk.

Next, the procedure of the film deposition processes using the film deposition apparatus 1 is described. First, while intermittently rotating the turntable 2 with the gate valve 18 opened, wafers W are sequentially transferred to the sent and received area S1 by the transfer mechanism 24 through the transfer opening 17. Thus, the wafers W are mounted on five circular concave portions 23 of the turntable 2. Next, the vacuum pump 65 evacuates through the first and second vacuum evacuation ports 62 and 63 to completely evacuate the inside of the vacuum chamber 11. Along with the evacuation, the turntable 2 is rotated in the clockwise direction at, for example, 240 rpm. At this time, the wafer W is heated at, for example, 300° C. by the heater 27.

Subsequently, a BTBAS gas as a first process gas and a $O_3$ gas and a $O_2$ gas as a second process gas are discharged from the process gas nozzles 31 and 32, respectively, and simultaneously an Ar gas and a $O_2$ gas as a plasma generating gas are discharged from the plasma generating gas nozzle 33. A $N_2$ gas as a separation gas is discharged from the separation gas nozzles 41 and 42, and simultaneously a $N_2$ gas as a purge gas is discharged from the center area C, the purge gas supplying pipe 28, and the purge gas supplying portion 29. The evacuation amounts from the first and second vacuum evacuation port 62, 63 are controlled by the pressure controller 66 to adjust the inside of the vacuum chamber to have a predetermined process pressure. At the same time, high frequency power is supplied to the antenna 72.

In response to the rotation of the turntable 2, the surface of the wafer W absorbs the first process gas in the first processing area P1. Next, in the second processing area P2, the first process gas absorbed on the wafer W reacts with the second process gas. Thus, one or a plurality of molecular layers of $SiO_2$ are formed as a reaction product. At this time, there is a case where an impurity such as moisture (OH radical) or an organic matter may be contained in the reaction product by, for example, a residual radical contained in the first process gas.

Meanwhile, on the lower side of the plasma processing unit 71, the electric field included in the electric and magnetic fields generated by high frequency power, which is supplied from the high frequency power source 74, is reflected or absorbed (attenuated) by the Faraday shield 81 so that the electric field is prevented from reaching inside (is shut off from) the vacuum chamber 11. The magnetic field passes through the slits 82 of the Faraday shield 81 and reaches inside the vacuum chamber 11 through the bottom surface of the casing 75. Therefore, the plasma generating gas discharged from the plasma generating gas nozzle 34 is activated by the magnetic field, which passes through the slits 82 and reaches the inside of the vacuum chamber 11, to thereby generate plasma such as ions and radicals.

When the plasma (active species) generated by the magnetic field contacts the surface of the wafer W, the reaction product is altered. Specifically, when the plasma crashes against the surface of the wafer W, the impurity may be discharged from the reaction product or elements in the reaction product may be rearranged so as to be densified (highly densified). As described, in response to the rotation of the turntable 2, the absorption of the first process gas onto the surface of the wafer W, the reaction of the components of the first process gas absorbed on the surface of the wafer W, and the plasma alteration of the reaction product are repeatedly performed in this order thereby laminating the molecular layers.

Figure 14:
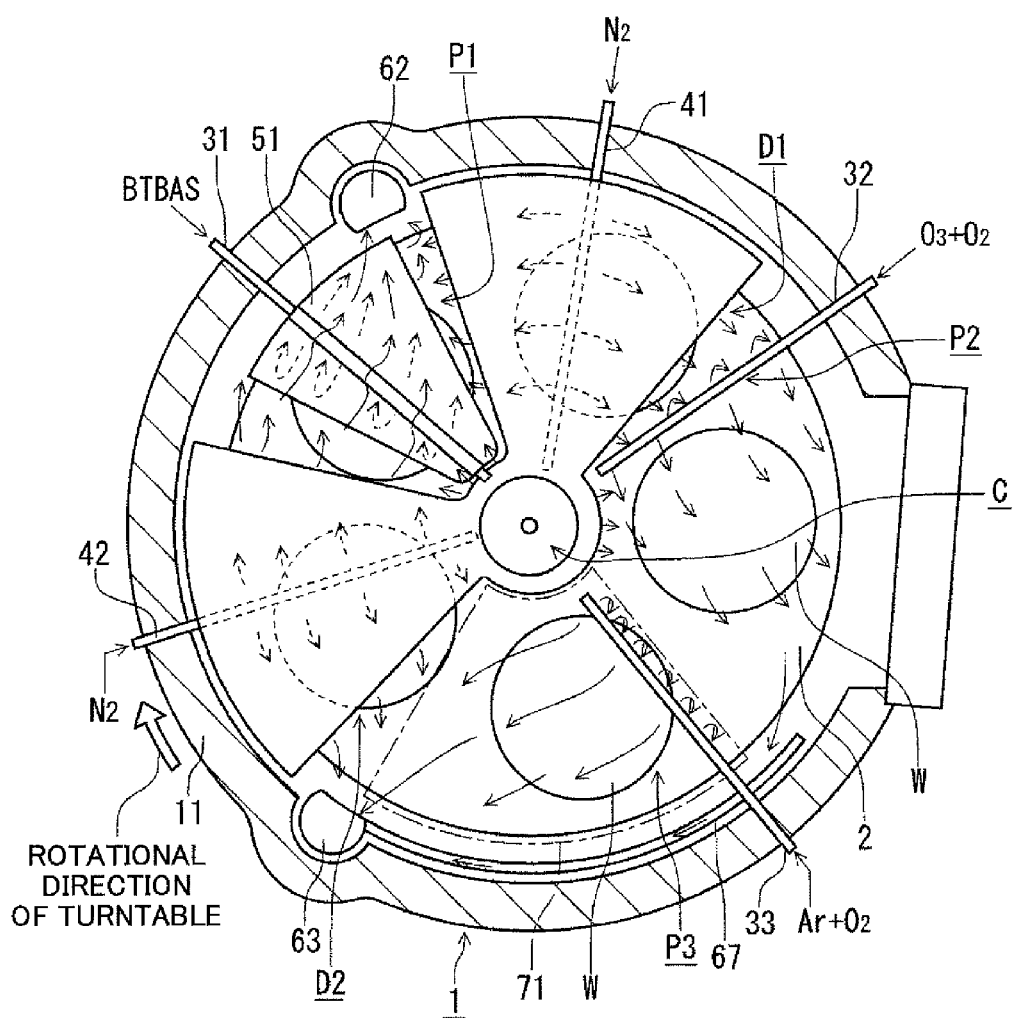
FIG. 14 schematically illustrates gas flows in depositing a film using the film deposition apparatus.

FIG. 14 is a horizontal cross-sectional view of the vacuum chamber 11. Referring to FIG. 14, gas flows are indicated by arrows in a manner similar to FIG. 5. Referring to FIGS. 5 and 14, the separation gas is supplied to the first and second separating areas D1 and D2 provided between the first and second processing areas P1 and P2. The gases are evacuated so as to prevent mixture of the first process gas, the second process gas, and the plasma generating gas. Further, since the purge gas is supplied below the turntable 2, the gas being tend to diffuse toward the lower side of the turntable 2 is pushed back toward the first and second vacuum evacuation ports 62 and 63 by the purge gas.

As described, the separation gas supplied from the second separation gas nozzle 42 flows toward the first processing area P1. As illustrated in FIG. 12, the speed of the turntable 2 on its peripheral side is higher than the speed of the turntable on its center side. Therefore, the separation gas moves at a higher speed on a side closer to the peripheral side of the first processing area P1. However, since the gap between the current plate 53 and the turntable 2 is formed to be smaller on a side closer to the peripheral side, the separation gas is apt to climb the nozzle cover 51. Said differently, in the first processing area, a difference between the catching amounts of the $N_2$ gas on the central side and on the peripheral side becomes small.

The separation gas climbing the nozzle cover 51 is evacuated from the first vacuum evacuation port 62. Further, a part of the first process excessively supplied to the first processing area P1 and a part of the separation gas caught in the first processing area P1 are evacuated from the first vacuum evacuation port 62. A $SiO_2$ film having a predetermined thickness is formed after the turntable 2 rotates by a predetermined number of times. Thereafter, the supply of the gases stops and the wafer is carried out from the film deposition apparatus by the operations performed in an order adverse to those performed in carrying in the wafer W.

The film deposition apparatus 1 includes the nozzle cover 51 forming the current plate 53 protruding from the first gas nozzle 31 on the upstream side in the rotational direction of the turntable 2. The current plate 53 is located so as to slant along the longitudinal direction of the current plate 53. The gap between the current plate 53 and the turntable 2 gradually decreases from the central side of the turntable 2 to the peripheral side of the turntable 2. Therefore, a degree of catching the $N_2$ gas supplied from the separating area D2 into the lower side of the current plate 53 between the central side of the turntable 2 and the peripheral side of the turntable 2 becomes small. Therefore, in the first processing area P1, the variation of the concentration of the first process gas between the central and peripheral sides of the turntable 2 is suppressed. Then, the first process gas can be adsorbed highly uniformly onto the surface of the wafer W. Consequently, it is possible to prevent the evenness of the film thickness of the $SiO_2$ film from degrading on the surface of the wafer W.

By locating the current plate 53 as described above, a difference in degrees of catching the $N_2$ gas becomes small. Therefore, the rotation speed of the turntable 2 can be relatively high. Accordingly, in the cycles of supplying the process gases and altering the film, the time necessary for one of the cycles can be reduced. Therefore, the productivity of the film deposition apparatus can be improved. Further, the first process gas can be prevented from being diluted by the separation gas on the peripheral side of the first processing area P1 and an adsorption reaction of the first process gas onto the wafer W is promoted. Therefore, the flow rate of the first process gas supplied from the first gas nozzle 31 can be reduced. Therefore, the manufacturing cost in the film deposition apparatus 1 can be reduced.

Further, the height of the nozzle cover 51 is freely adjustable on the outer peripheral side of the nozzle cover 51 by the screw provided on the pillar 503. Since the height of the nozzle cover 51 is freely adjustable, the slant of the nozzle cover 51 is adjustable in response to a height position where the turntable 2 is attached to the vacuum chamber 11. Said differently, if the accuracy of attaching the turntable 2 is low and the turntable 2 is not attached to a predetermined height position, the peripheral gap h2 can be made a predetermined value. Therefore, the nozzle cover 51 can be easily attached to the film deposition apparatus 1.

Figure 15:
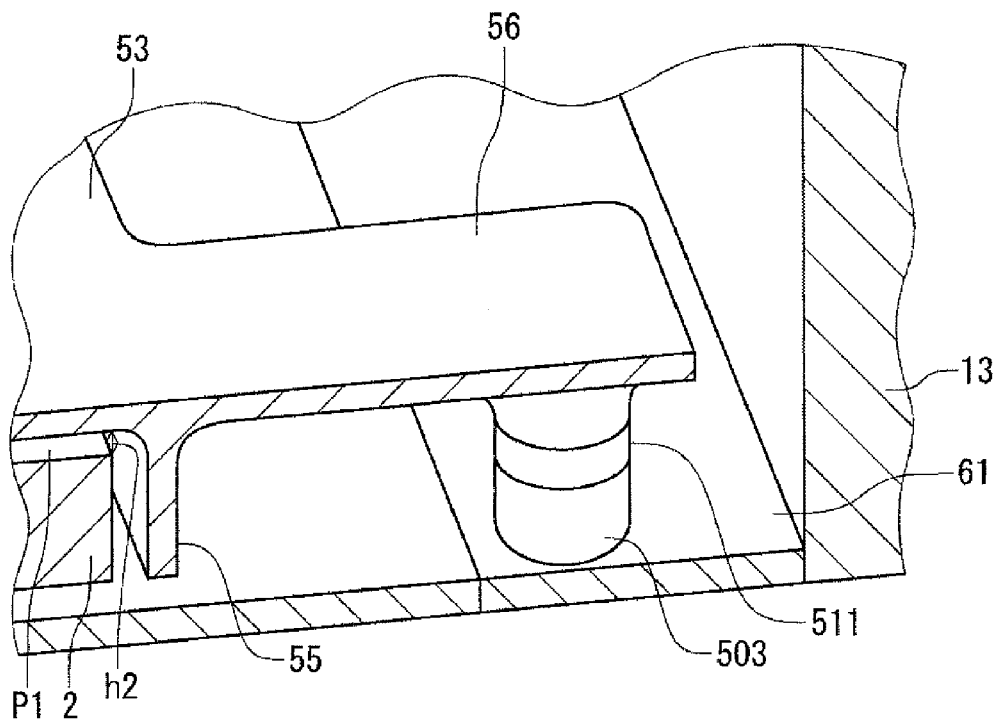
FIG. 15 is a perspective view of another nozzle cover on an outer peripheral side of the turntable.

The slant adjustment of the nozzle cover 51 is not limited to the adjustment using the screw. FIG. 15 illustrates an example that a spacer 511 is provided between the extended portion 56 and the pillar 503. The spacer 511 is freely attachable to or detachable from the extended portion 56 and the pillar 503. Other spacers 511 having various heights are prepared. The slant can be adjusted by replacing the spacers 511. Alternatively, there are prepared a plurality of other nozzle covers 51 each integrally formed with a corresponding extended portion 56 and a corresponding pillar 503. The heights of the pillars 503 are different for each of the other nozzle covers 51. The slant may be adjusted by replacing any one of the other nozzle covers 51.

Figure 16:
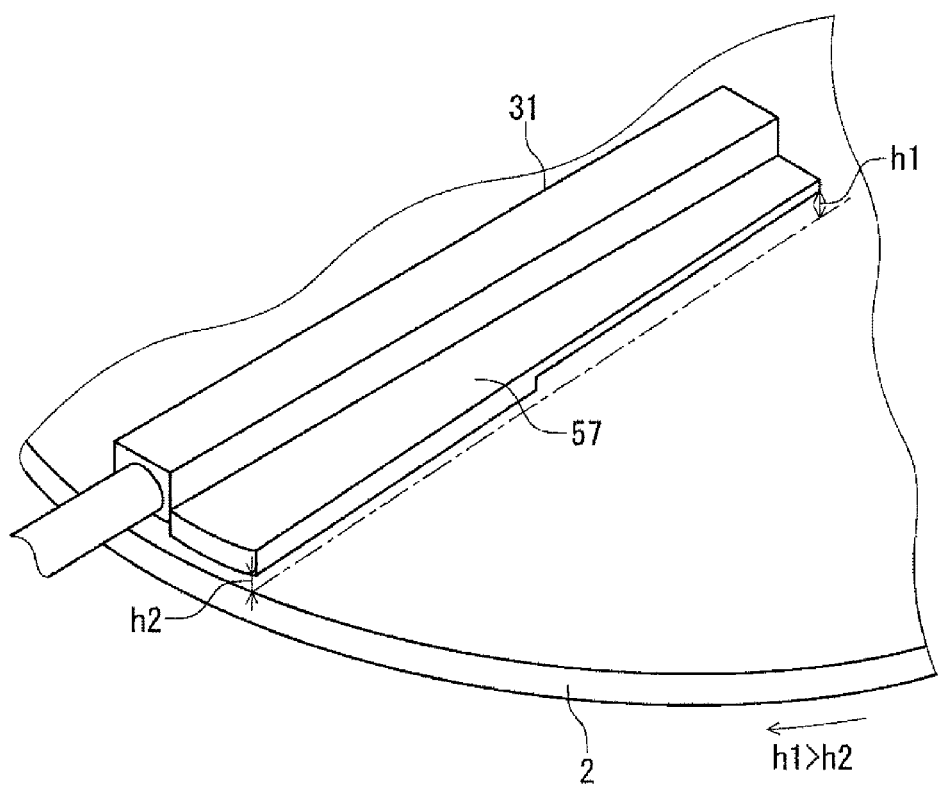
FIG. 16 is a perspective view of another constructional example of a current plate.

The central gaps h1 of the current plates 53 and 54 may not be equal. The peripheral gaps h2 of the current plates 53 and 54 may not be equal. The shape of the current plate 53 is not limited to the above example. Referring to FIG. 16, the current plate 57 is provided to the first process gas nozzle 31 in place of the current plate 53. A dot chain line in FIG. 16 is an imaginary line on the surface of the turntable 2. The current plate 57 is provided in parallel with the turntable 2. A step is formed on the lower surface of the current plate 57. The height of a half of the current plate 57 on the central side of the turntable 2 is greater than the height of a half of the current plate 57 on the peripheral side of the turntable 2. Said differently, there is a relationship of the central gap h1>the peripheral gap h2. The gap between the current plate 57 and the turntable 2 is gradually reduced from the central side to the peripheral side. In the current plate 57, the difference of the gaps h1 and h2 is set to 1 mm or greater. Referring to FIG. 16, only the current plate on the upstream side in the rotational direction may be provided to the first process gas nozzle 31 without providing a current plate on the downstream side in the rotational direction. The current plates 53 and 57 are not limited to be in a fan-like shape in their plan views and may be in a rectangle-like shape in their plan views. However, it is preferable to be in the fan-like shape in order to enhance uniformity of the process in the radius directions of the turntable 2.

Further, these current plates 53 and 57 may be applicable to an apparatus having two processing areas separated by a separating area. Therefore, these current plates 53 and 57 are not limited to be used in the above-described film deposition apparatus 1. For example, in the above-described film deposition apparatus 1, plasma may be generated in the second processing area P2, or the processing area 23 may not be provided.

<Evaluation Test 1>

An evaluation test performed by simulating the film deposition apparatus 1 of the embodiment of the present invention is described. As the evaluation test 1, the turntable 2 is rotated as in the embodiment, the evacuation is simultaneously performed from the first vacuum evacuation port 62, and the gas is simultaneously discharged from the first process gas nozzle. At this time, a distribution of a mass ratio of the gas in the first processing area 21 and the vicinity thereof is measured. At the time of discharging the gas, the pressure inside the vacuum chamber 11 is set to 2 Torr and the temperature of the vacuum chamber 11 is set to 600° C. The gas is a Si containing gas for forming a low temperature oxide (LTO) film, and the flow rate of the gas is set to 0.1 slm (L/min).

At every time when the measurements are done, the rotation speed of the turntable 2 at the time of supplying the Si containing gas is changed. The rotation speed is set to 20 rpm, 120 rpm, and 240 rpm. The measurements conducted after setting the rotation speed to 20 rpm, 120 rpm, and 240 rpm are referred to as the evaluation test 1-1, the evaluation test 1-2, and the evaluation test 1-3, respectively. However, in the evaluation test 1, the current plates 53 and 54 are not slanted relative to the turntable 2 as in the above embodiment and are arranged on parallel to the turntable 2. The heights of the current plates 53 and 54 from the turntable 2 are set to 3 mm.

Figure 17:
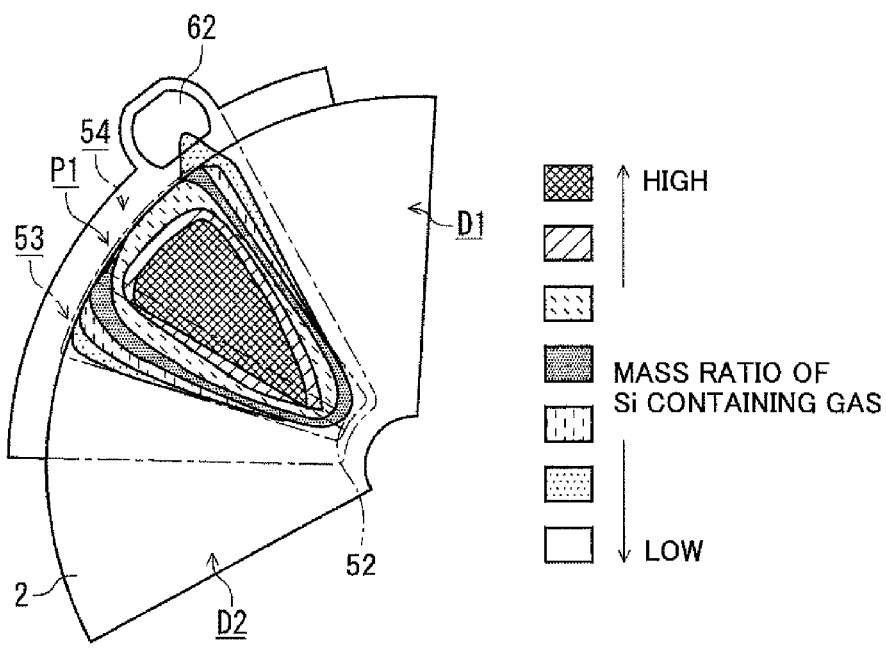
FIG. 17 schematically illustrates a result of an evaluation test.
Figure 18:
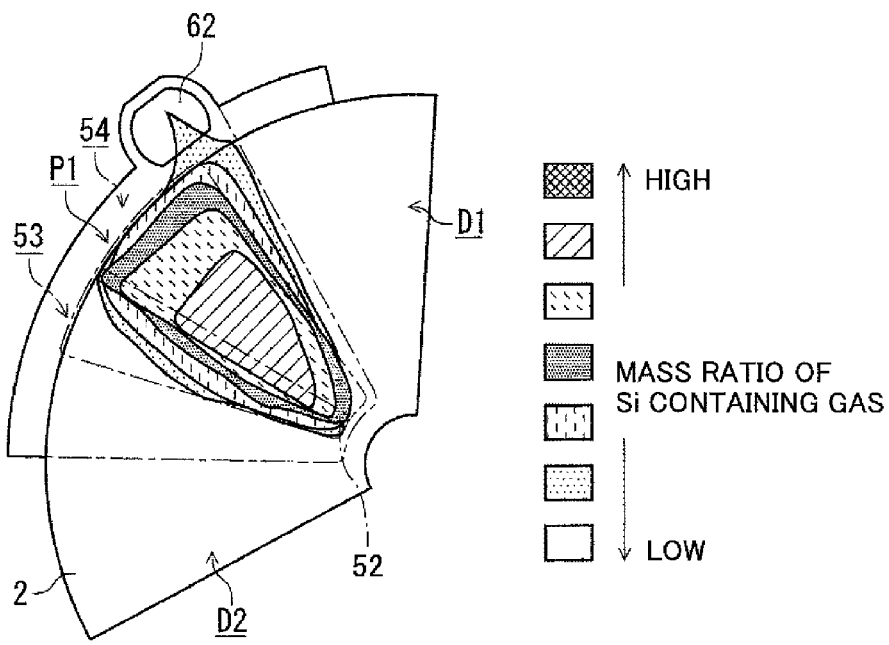
FIG. 18 schematically illustrates the result of an evaluation test.
Figure 19:
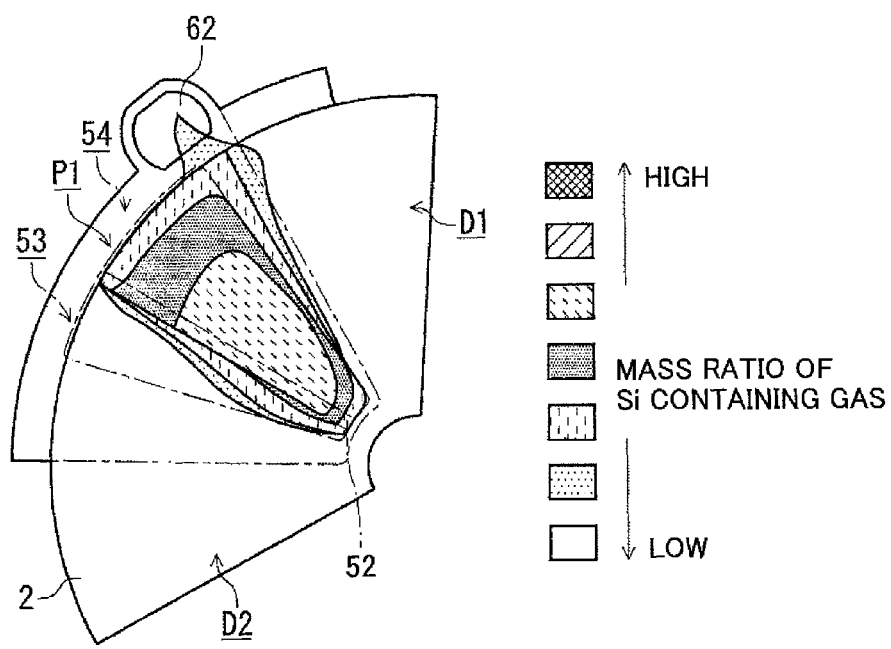
FIG. 19 schematically illustrates the result of another evaluation test.

FIGS. 17, 18, and 19 illustrate the test results of the evaluation tests 1-1, 1-2, and 1-3. Referring to FIGS. 17, 18, and 19 illustrating the evaluation test 1 and the other evaluation tests described later, the insides of the vacuum chamber 11 are partitioned by contour lines for predetermined ranges of the mass ratio of the Si containing gas. In thus partitioned vacuum chamber 11, a mesh design is given to a region where the mass ratio is 100% or smaller and 90% or greater, diagonal solid lines are given to a region where the mass ratio is 90% or smaller and 80% or greater, and diagonal dotted lines are given to a region where the mass ratio is 80% or smaller and 60% or greater. Further, a relatively great amount of dots are given to a region where the mass ratio is 60% or smaller and 40% or greater, vertical dash lines are given to a region where the mass ratio is 40% or smaller and 20% or greater, and relatively small number of dots are given to a region where the mass ratio is 20% or smaller and 10% or greater. No design is given to a region where the mass ratio is smaller than 10%. In the evaluation test, as long as otherwise noted, the peripheral sides of the current plates 53 and 54 designate the side toward the outside of the turntable 2 in the radius directions.

From the results of the evaluation tests 1-1 to 1-3, it is known that as the rotation speed of the turntable 2 increases the mass ratio of the Si containing gas of the processing area P1 is lowered, and the mass ratios of the gases on the peripheral sides and below the current plate 53 and 54 are lowered in comparison with the mass ratios of the gases on the central sides. By comparing the result of the evaluation test 1-1 and the result of the evaluation test 1-3, it is known that the mass ratio of the Si containing gas on the peripheral side and below the current plate 52 is greatly dropped when the rotation speed increases. This phenomenon is caused because a great quantity of the separation gas is caught by the peripheral side of the turntable 2, on which side the speed of the rotation table is faster than the central side of the turntable 2.

<Evaluation Test 2>

Subsequently, the evaluation test 2 is performed to check effects appearing by slanting the current plates 53 and 54. The measurements in the evaluation test 2 are substantially similar to the measurements in the evaluation test 1. However, the slants of the current plates 53 and 54 are changed at each of the measurements. The measurements are referred to as the evaluation test 2-1, the evaluation test 2-2, and the evaluation test 2-3, respectively. In the evaluation test 2-1, in a manner similar to the evaluation test 1, the current plates 53 and 54 are horizontally arranged. The central gap h1 and the peripheral gap h2 are 3 mm. In the evaluation test 2-2, the current plates 53 and 54 are set to slant relative to the turntable 2.

The central gap h1 is 3 mm, and the peripheral gap h2 is 2 mm. In the evaluation test 2-3, in a manner similar to the embodiment, the central gap h1 is set to 3 mm and the peripheral gap h2 is set to 1 mm, respectively. In these evaluation tests 2-1, 2-2, and 2-3, the rotation speeds of the turntable 2 is set to 240 rpm, and the flow rates of the separation gases from the separation gas nozzles 41 and 42 are set to 5 slm.

Figure 20:
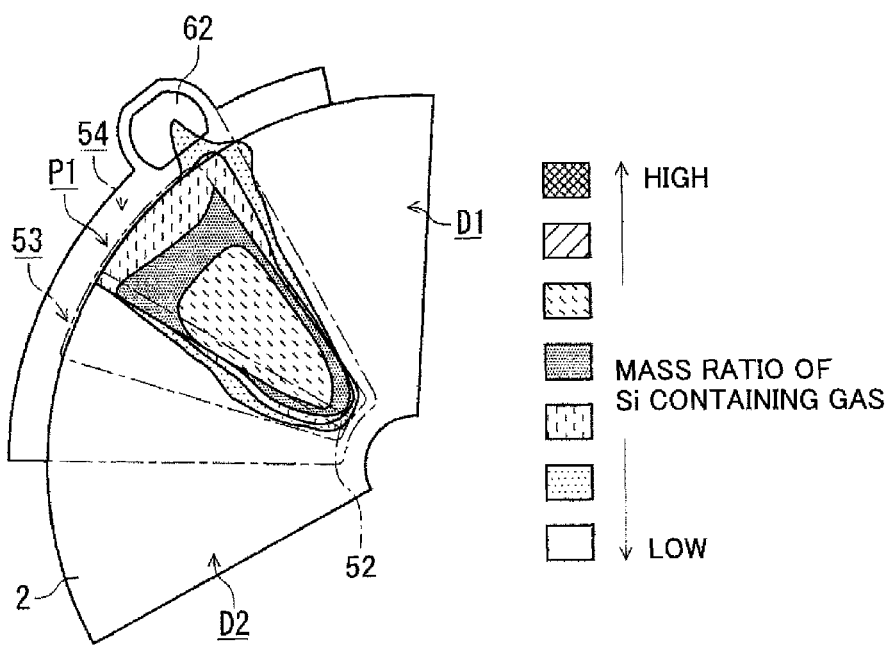
FIG. 20 schematically illustrates the result of another evaluation test.
Figure 21:
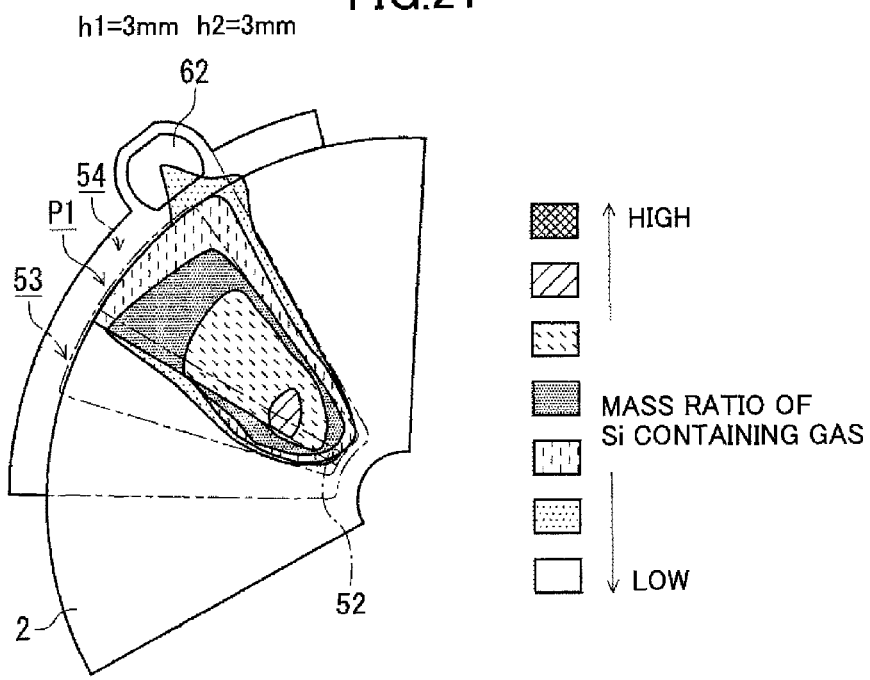
FIG. 21 schematically illustrates the result of another evaluation test.
Figure 22:
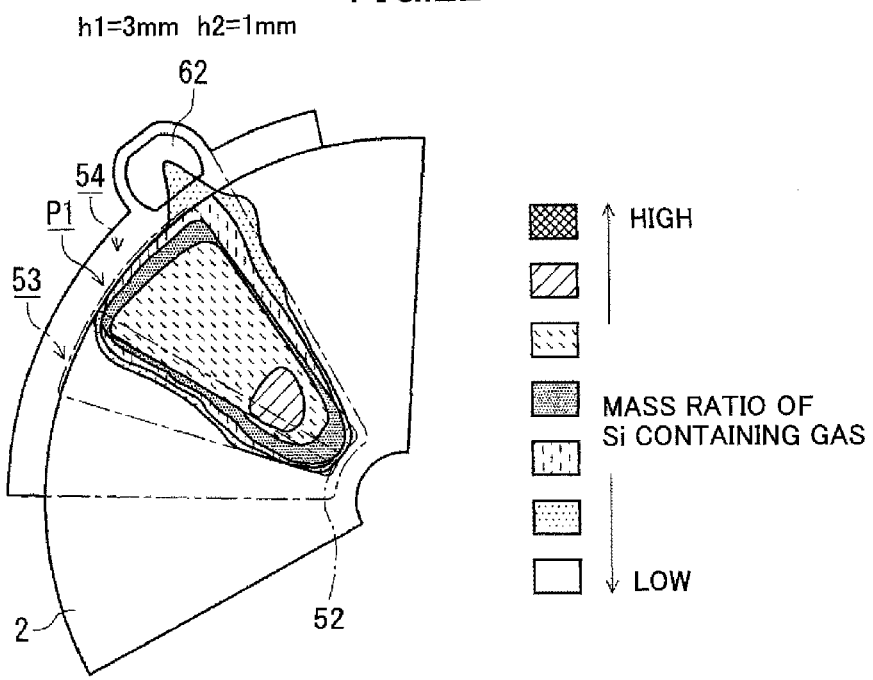
FIG. 22 schematically illustrates the result of another evaluation test.

FIGS. 20, 21, and 22 illustrate the test results of the evaluation tests 2-1, 2-2, and 2-3. The results of the evaluation tests 2-1 and 2-2 show that the mass ratios of the Si containing gases on the peripheral side and below the current plates 53 and 54 are relatively small. Between the evaluation tests 2-1 and 2-2, there is no great change in the distributions of the mass ratios of the gases on the peripheral sides. However, by comparing the results of the evaluation tests 2-1 and 2-2 and the result of the evaluation test 2-3, the mass ratio of the Si containing gas on the peripheral side and below the current plates 53 and 54 is high in the evaluation test 2-3. Therefore, dispersion of the mass ratio of the Si containing gas in the radius directions of the turntable 2 is suppressed. Therefore, it is proved that the separation gas is prevented from being caught by the first processing area P1 by adjusting the slant of the nozzle cover 51. Thus, the effects of the embodiment of the present invention are confirmed.

<Evaluation Test 3>

The same conditions as those of the evaluation test 2 are used except that the gas flow rate supplied from the first gas nozzle 31 is set to 200 sccm. In a manner similar to the evaluation test 2, the slants of the current plates 53 and 54 are changed for each measurement. In the evaluation test 3-1, in a manner similar to the evaluation test 2-1, the central gap h1 and the peripheral gap h2 are set to 3 mm, respectively. In the evaluation test 3-2, in a manner similar to the evaluation test 2-2, the central gap h1 is set to 3 mm and the peripheral gap h2 is set to 2 mm, respectively. In the evaluation test 3-3, in a manner similar to the evaluation test 2-3, the central gap h1 is set to 3 mm and the peripheral gap h2 is set to 1 mm, respectively.

Figure 23:
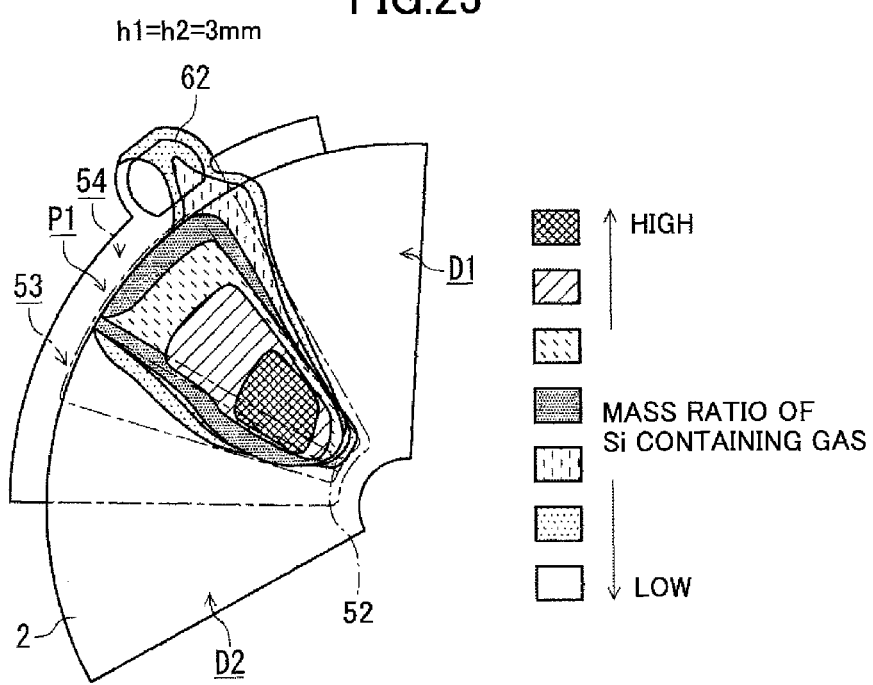
FIG. 23 schematically illustrates the result of another evaluation test.
Figure 24:
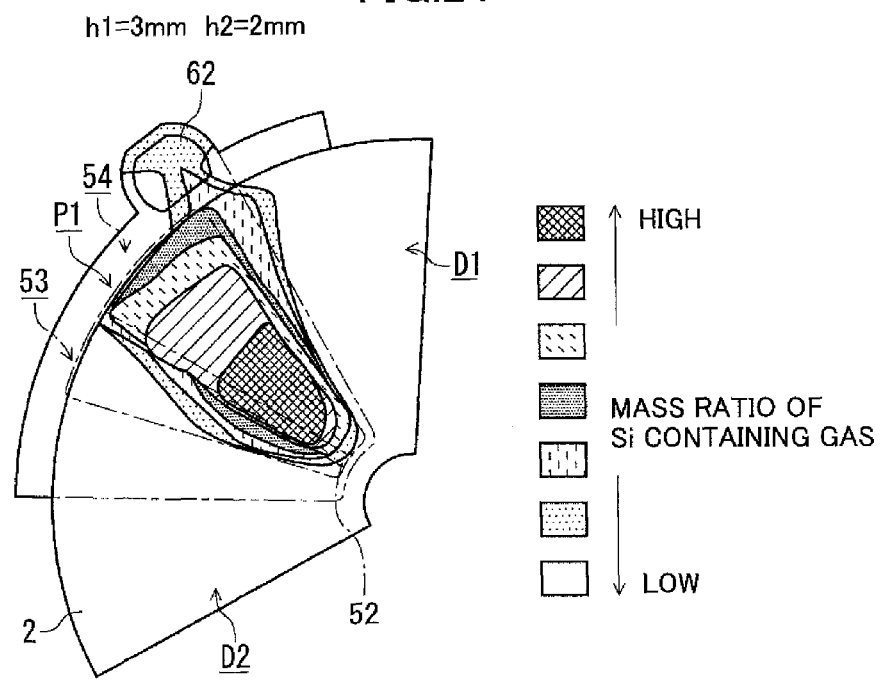
FIG. 24 schematically illustrates the result of another evaluation test.
Figure 25:
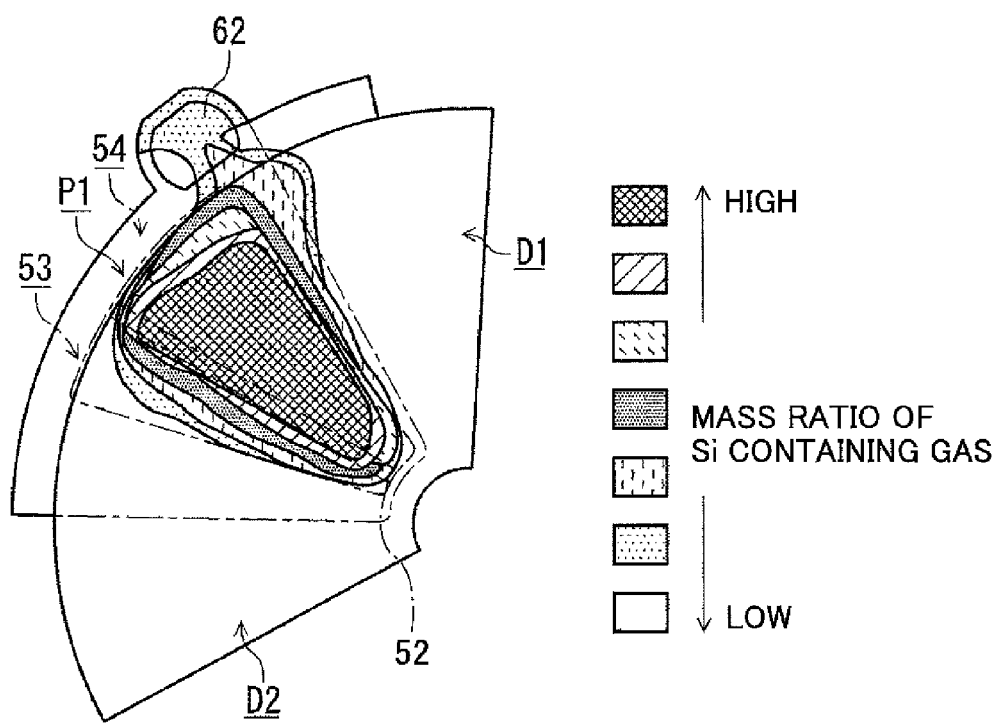
FIG. 25 schematically illustrates the result of another evaluation test.

FIGS. 23, 24, and 25 illustrate the test results of the evaluation tests 3-1, 3-2, and 3-3. However, by comparing the results of the evaluation tests 3-1 and 3-2 and the result of the evaluation test 3-2, the mass ratio of the Si containing gas on the peripheral side and below the current plate 54 is high in the evaluation test 3-2. From the results of the evaluation tests 3-3 and 3-2, the mass ratio of the Si containing gas on the peripheral side and below the current plate 54 is much higher in the evaluation test 3-3 than in the evaluation test 3-2. Further, the mass ratio of the Si containing gas on the peripheral side and below the current plate 53 is higher in the evaluation test 3-3 than in the evaluation test 3-2. Therefore, dispersion of the mass ratio of the Si containing gas in the radius directions of the turntable 2 is suppressed. In comparison with the evaluation tests 2-3 and 2-2, good results where dispersion of the mass ratios of the gases is suppressed are obtained in the evaluation tests 3-3 and 3-2. As such, the effects of the embodiment of the present invention are confirmed in a manner similar to the evaluation test 2.

An object of the embodiment is to provide a film deposition apparatus which causes a substrate to be orbitally revolved around on the turntable, sequentially supplies a plurality of types of process gases to the substrate to laminate a layer of a reaction product thereby obtaining a thin film, and includes at least one process gas supplying portion including a gas nozzle and a current plate. Within the embodiment, the current plate is installed such that the gap between the current plate and the turntable is gradually reduced from one end on the central side to the other end on the peripheral side, and the gap on the other end is smaller than the gap on the one end by 1 mm or greater. Therefore, the difference between the degrees of catching the separation gas below the current plate and on the central and peripheral sides becomes small. Then, it is possible to suppress degradation of in-plane evenness of film thicknesses.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the claims have been described in detail, it should be understood that the various changes, substitutions, and alterations could be made hereto without departing from the spirit and scope of the invention.

What is claimed is:

1. A film deposition apparatus that is provided to obtain a thin film by laminating layers of reaction product by repeating a plurality of cycles of sequentially supplying a plurality of types of process gases that mutually reacts in a vacuum atmosphere, the film deposition apparatus comprising:

a turntable that is arranged inside a vacuum chamber and receives the substrate on the turntable to cause the substrate to orbitally revolve;

a plurality of process gas supplying portions for supplying mutually different process gases to separated areas separated in peripheral directions of the turntable;

a separation gas supplying portion for supplying a separation gas which separates the mutually different process gases; and an evacuating mechanism for evacuating an inside of the vacuum chamber so as to be a vacuum, wherein at least one process gas supplying portion of the plurality of process gas supplying portions extends between a peripheral portion of the turntable and a central portion of the turntable, the at least one process gas supplying portion includes a gas nozzle having gas discharge ports arranged in a longitudinal direction of the at least one process gas supplying portion for discharging one process gas of the mutually different process gases toward the turntable and a current plate provided on an upstream side of a rotational direction of the turntable from the gas nozzle and along the longitudinal direction of the gas nozzle to allow the separation gas to flow onto an upper surface of the current plate, and wherein the current plate is provided so that a gap between the current plate and the turntable is gradually decreased from one end on a central side of the turntable to another end on a peripheral side of the turntable, and the gap at said another end is smaller than the gap at said one end by 1 mm or greater.

2. The film deposition apparatus according to claim 1, wherein the gap at said another end is smaller than the gap at said one end by 1.5 mm or smaller.

3. The film deposition apparatus according to claim 1, wherein the gap at said one end is 2 mm to 6 mm.

4. The film deposition apparatus according to claim 1, further comprising:

a slant adjusting portion for adjusting a slant of the current plate in the longitudinal direction of the gas nozzle.

5. A method of depositing a film that obtains a thin film by laminating layers of reaction product by repeating a plurality of cycles sequentially supplying a plurality of types of process gases that mutually reacts in a vacuum atmosphere, the method using a film deposition apparatus that includes a plurality of process gas supplying portions for supplying mutually different process gases to separated areas on a surface of a turntable inside a vacuum chamber, the separated areas being separated in peripheral directions of the turntable, wherein at least one process gas supplying portion of the plurality of process gas supplying portions extends between a peripheral portion of the turntable and a central portion of the turntable, the at least one process gas supplying portion includes a gas nozzle having gas discharge ports arranged in a longitudinal direction of the at least one process gas supplying portion for discharging one process gas of the mutually different process gases toward the turntable and a current plate provided on an upstream side of a rotational direction of the turntable from the gas nozzle and along the longitudinal direction of the gas nozzle to allow a separation gas to flow onto an upper surface of the current plate, and wherein the current plate is provided so that a gap between the current plate and the turntable gradually is decreased from one end on a central side of the turntable to another end on a peripheral side of the turntable, and the gap at said another end is smaller than the gap at said one end by 1 mm or greater, the method comprising:
- mounting a substrate on the turntable;
- rotating the turntable at a rotation speed of 60 rpm or faster to orbitally revolve the substrate;
- supplying the mutually different process gases from the plurality of process gas supplying portions during the rotating the turntable; and
- supplying the separation gas between the separated areas, into which the mutually different process gases are supplied, to separate the mutually different process gases during the rotating the turntable.

\* \* \* \* \*